(12) United States Patent
Ogura et al.

(10) Patent No.: US 11,257,692 B2
(45) Date of Patent: Feb. 22, 2022

(54) SUBSTRATE PROCESSING APPARATUS, MIXING METHOD, AND SUBSTRATE PROCESSING METHOD

(71) Applicant: Tokyo Electron Limited, Tokyo (JP)

(72) Inventors: Kouji Ogura, Kumamoto (JP); Jun Nonaka, Kumamoto (JP); Takao Inada, Kumamoto (JP); Yoshinori Nishiwaki, Tokyo (JP); Hiroshi Yoshida, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/816,530

(22) Filed: Mar. 12, 2020

(65) Prior Publication Data
US 2020/0294823 A1    Sep. 17, 2020

(30) Foreign Application Priority Data

Mar. 15, 2019  (JP) ............................. JP2019-048845
Jan. 7, 2020   (JP) ............................. JP2020-000624

(51) Int. Cl.
     *H01L 21/67*       (2006.01)
(52) U.S. Cl.
     CPC .. *H01L 21/67086* (2013.01); *H01L 21/67017* (2013.01)

(58) Field of Classification Search
     CPC ................................................ H01L 21/67017
     See application file for complete search history.

(56) References Cited

U.S. PATENT DOCUMENTS

2016/0035597 A1*  2/2016  Hinode ............. H01L 21/67017
                                                          216/84
2019/0096711 A1*  3/2019  Ohno ................ H01L 21/67017

FOREIGN PATENT DOCUMENTS

| JP | 2002-093773 A |   | 3/2002  |
|----|---------------|---|---------|
| JP | 2009206419  A | * | 9/2009  |
| JP | 2016-032030 A |   | 3/2016  |
| JP | 2017-118092 A |   | 6/2017  |
| JP | 2018139259  A | * | 9/2018  |
| WO | 2017/169602 A1|   | 10/2017 |

* cited by examiner

*Primary Examiner* — Binh X Tran
(74) *Attorney, Agent, or Firm* — Abelman, Frayne & Schwab

(57) ABSTRACT

A substrate processing apparatus includes a processing bath, a mixing device, a liquid path, and a silicon solution supply. A substrate is immersed in the processing bath to be processed. The mixing device generates a mixture liquid by mixing a phosphoric acid aqueous solution with an additive that suppresses precipitation of silicon oxide. The liquid path sends the mixture liquid from the mixing device to the processing bath. The silicon solution supply is connected to at least one of the liquid path and the processing bath, and supplies a silicon-containing compound aqueous solution to the mixture liquid supplied from the mixing device.

11 Claims, 15 Drawing Sheets

SUBSTRATE PROCESSING APPARATUS, MIXING METHOD, AND SUBSTRATE PROCESSING METHOD

CROSS-REFERENCE TO RELATED APPLICATIONS

This application is based on and claims priority from Japanese Patent Application Nos. 2019-048845 and 2020-000624 filed on Mar. 15, 2019 and Jan. 7, 2020, respectively, with the Japan Patent Office, the disclosures of which are incorporated herein in their entireties by reference.

TECHNICAL FIELD

The present disclosure relates to a substrate processing apparatus, a mixing method, and a substrate processing method.

BACKGROUND

In a substrate processing system, it has been known that an etching processing is performed on a substrate by immersing such a substrate in an etching liquid including a phosphoric acid aqueous solution and a silicon solution (see Japanese Patent Laid-Open Publication No. 2017-118092).

SUMMARY

According to an aspect of the present disclosure, a substrate processing apparatus includes a processing bath, a mixing device, a liquid sending path, and a silicon solution supply. The processing bath processes a substrate through immersion. The mixing device generates a mixture liquid by mixing a phosphoric acid aqueous solution with an additive that suppresses precipitation of silicon oxide. The liquid sending path sends the mixture liquid from the mixing device to the processing bath. The silicon solution supply is connected to at least one of the liquid sending path and the processing bath, and supplies a silicon-containing compound aqueous solution to the mixture liquid supplied from the mixing device.

The foregoing summary is illustrative only and is not intended to be in any way limiting. In addition to the illustrative aspects, embodiments, and features described above, further aspects, embodiments, and features will become apparent by reference to the accompanying drawings and the following detailed description.

DESCRIPTION OF EMBODIMENT

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a substrate processing apparatus, a mixing method, and a substrate processing method according to the present disclosure will be described in detail with reference to accompanying drawings. The present disclosure is not limited by the embodiment to be described below. It should be noted that the drawings are schematic, and for example, a dimensional relationship of elements, and a ratio of the elements are different from actual ones in some cases. Further, in some cases, the drawings may include portions which are mutually different from each other in the dimensional relationship or the ratio.

In a substrate processing system, it has conventionally been known that an etching processing is performed on a substrate by immersing such a substrate in an etching liquid including a phosphoric acid aqueous solution and a silicon solution.

For example, by immersing the substrate in the phosphoric acid ($H_3PO_4$) aqueous solution, it is possible to selectively etch a silicon nitride film between the silicon nitride film (SiN) and a silicon oxide film ($SiO_2$) laminated on the substrate.

By adding the silicon solution (a silicon-containing compound aqueous solution) to the phosphoric acid aqueous solution, it is possible to improve the etching selectivity of the silicon nitride film to the silicon oxide film.

Meanwhile, when the silicon nitride film is etched, silicon contained in such a silicon nitride film is eluted into the etching liquid. Thus, in some cases, a silicon concentration in the phosphoric acid aqueous solution becomes excessive.

Then, when the silicon concentration in the phosphoric acid aqueous solution becomes excessive, silicon oxide ($SiO_2$) is deposited on the silicon oxide film, and there is a concern that an etching processing of the substrate may be suppressed due to such deposited silicon oxide.

Therefore, a technology in which it is possible to properly perform an etching processing by an etching liquid containing a phosphoric acid aqueous solution and a silicon solution is expected.

<Configuration of Substrate Processing System>

Figure 1:
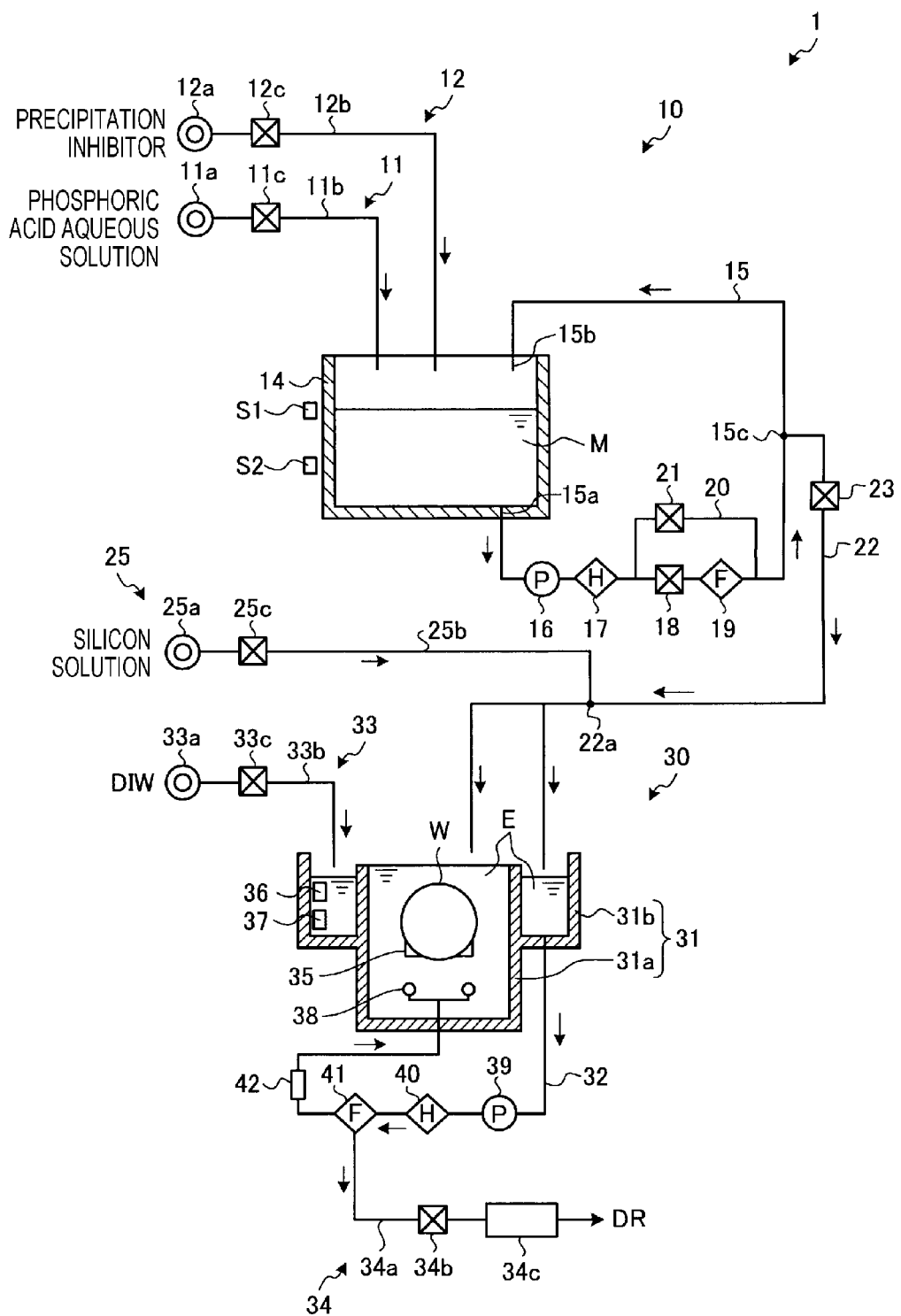
FIG. 1 is a schematic block diagram illustrating the configuration of a substrate processing system according to an embodiment.

First, the configuration of a substrate processing system 1 according to an embodiment will be described with reference to FIG. 1. FIG. 1 is a schematic block diagram illustrating the configuration of the substrate processing system 1 according to the embodiment. The substrate processing system 1 is an example of a substrate processing apparatus.

The substrate processing system 1 includes a mixing device 10, a silicon solution supply 25, and a substrate processor 30. The mixing device 10 generates a mixture liquid M by mixing a phosphoric acid aqueous solution with a precipitation inhibitor that suppresses precipitation of silicon oxide. The precipitation inhibitor is an example of an additive.

The silicon solution supply 25 supplies a silicon-containing compound aqueous solution (hereinafter, also referred to as a silicon solution) to the mixture liquid M generated by the mixing device 10 so as to generate an etching liquid E. That is, the etching liquid E according to the embodiment contains the phosphoric acid aqueous solution, the precipitation inhibitor, and the silicon solution.

The substrate processor 30 performs an etching processing on a wafer W by immersing such a wafer W in the generated etching liquid E in a processing bath 31. The wafer W is an example of a substrate. In the embodiment, for example, it is possible to selectively etch a silicon nitride film between the silicon nitride film (SiN) and a silicon oxide film ($SiO_2$) formed on the wafer W.

The mixing device 10 includes a phosphoric acid aqueous solution supply 11, a precipitation inhibitor supply 12, a tank 14, and a circulation path 15.

The phosphoric acid aqueous solution supply 11 supplies the phosphoric acid aqueous solution to the tank 14. This phosphoric acid aqueous solution supply 11 includes a phosphoric acid aqueous solution supply source 11a, a phosphoric acid aqueous solution supply path 11b, and a flow rate regulator 11c.

The phosphoric acid aqueous solution supply source 11a is, for example, a tank that stores the phosphoric acid aqueous solution. The phosphoric acid aqueous solution supply path 11b connects the phosphoric acid aqueous solution supply source 11a to the tank 14, and supplies the phosphoric acid aqueous solution from the phosphoric acid aqueous solution supply source 11a to the tank 14.

The flow rate regulator 11c is provided in the phosphoric acid aqueous solution supply path 11b, and adjusts the flow rate of the phosphoric acid aqueous solution to be supplied to the tank 14. The flow rate regulator 11c is constituted by, for example, an open/close valve, a flow rate control valve, or a flow meter.

The precipitation inhibitor supply 12 supplies the precipitation inhibitor to the tank 14. This precipitation inhibitor supply 12 includes a precipitation inhibitor supply source 12a, a precipitation inhibitor supply path 12b, and a flow rate regulator 12c.

The precipitation inhibitor supply source 12a is, for example, a tank that stores the precipitation inhibitor. The precipitation inhibitor supply path 12b connects the precipitation inhibitor supply source 12a to the tank 14, and supplies the precipitation inhibitor from the precipitation inhibitor supply source 12a to the tank 14.

The flow rate regulator 12c is provided in the precipitation inhibitor supply path 12b, and adjusts the flow rate of precipitation inhibitor to be supplied to the tank 14. The flow rate regulator 12c is constituted by, for example, an open/close valve, a flow rate control valve, or a flow meter.

The precipitation inhibitor according to the embodiment only has to contain a component that suppresses precipitation of silicon oxide. For example, the precipitation inhibitor may contain a component that stabilizes silicon ions dissolved in the phosphoric acid aqueous solution in a dissolved state and suppresses the precipitation of silicon oxide. Further, the precipitation inhibitor may contain a component that suppresses the precipitation of silicon oxide by other known methods.

As for the precipitation inhibitor according to the embodiment, for example, a hexafluorosilicic acid ($H_2SiF_6$) aqueous solution containing a fluorine component may be used. An additive such as ammonia may be contained in order to stabilize hexafluorosilicic acid in the aqueous solution.

As for the precipitation inhibitor according to the embodiment, for example, ammonium hexafluorosilicate ($(NH_4)_2SiF_6$), or sodium hexafluorosilicate ($Na_2SiF_6$) may be used.

The precipitation inhibitor according to the embodiment may be a compound containing an element that is a cation having an ion radius ranging from 0.2☐ to 0.9☐. Here, the "ion radius" is a radius of an ion empirically found from the sum of radii of an anion and a cation, which is obtained from a lattice constant of a crystal lattice.

The precipitation inhibitor according to the embodiment may contain oxide of any one of elements, for example, aluminum, potassium, lithium, sodium, magnesium, calcium, zirconium, tungsten, titanium, molybdenum, hafnium, nickel and chromium.

The precipitation inhibitor according to the embodiment may contain at least one of nitride, chloride, bromide, hydroxide and nitrate of the above described one element, instead of or in addition to the above described oxide of any one element.

The precipitation inhibitor according to the embodiment may contain at least one of, for example, $Al(OH)_3$, $AlCl_3$, $AlBr_3$, $Al(NO_3)_3$, $Al_2(SO_4)_3$, $AlPO_4$ and $Al_2O_3$.

The precipitation inhibitor according to the embodiment may contain at least one of KCl, KBr, KOH and $KNO_3$. The precipitation inhibitor according to the embodiment may contain at least one of LiCl, NaCl, $MgCl_2$, $CaCl_2$ and $ZrCl_4$.

The tank 14 stores the phosphoric acid aqueous solution supplied from the phosphoric acid aqueous solution supply 11, and the precipitation inhibitor supplied from the precipitation inhibitor supply 12. Also, the tank 14 stores the mixture liquid M generated by mixing the phosphoric acid aqueous solution with the precipitation inhibitor.

The tank 14 is provided with a first liquid level sensor S1 and a second liquid level sensor S2 in order from top. This controls the height of a liquid level of the phosphoric acid aqueous solution or the mixture liquid M stored in the tank 14. In the embodiment, by using the first liquid level sensor S1 and the second liquid level sensor S2, it is possible to measure the liquid volume of the phosphoric acid aqueous solution or the precipitation inhibitor.

The circulation path 15 is a circulation line that exits from the tank 14, and returns to the tank 14. The circulation path 15 has an inlet 15a provided at the bottom of the tank 14 and an outlet 15b provided at the top of the tank 14, and forms a circulating flow that flows from the inlet 15a toward the outlet 15b. In the embodiment, the outlet 15b is disposed above the liquid level of the mixture liquid M stored in the tank 14.

In the circulation path 15, a pump 16, a heater 17, an open/close valve 18, a filter 19, and a diverging portion 15c are provided in order from the upstream side with respect to the tank 14. A liquid sending path 22 that sends the mixture liquid M to the processing bath 31 of the substrate processor 30 diverges from the diverging portion 15c.

The liquid sending path 22 is connected from the diverging portion 15c to an inner tank 31a and an outer tank 31b of the processing bath 31, and includes a flow rate regulator 23. The flow rate regulator 23 adjusts the flow rate of the mixture liquid M to be supplied to the processing bath 31. The flow rate regulator 23 is constituted by, for example, an open/close valve, a flow rate control valve, or a flow meter.

The pump 16 forms a circulating flow of the mixture liquid M that exits from the tank 14, and returns to the tank 14 through the circulation path 15.

The heater 17 heats the mixture liquid M circulating in the circulation path 15. In the embodiment, the heater 17 heats the mixture liquid M, thereby heating the mixture liquid M stored in the tank 14.

The filter 19 removes contaminants such as particles included in the mixture liquid M circulating in the circulation path 15. A bypass flow path 20 that bypasses the filter 19 is provided in the circulation path 15, and an open/close valve 21 is provided in the bypass flow path 20.

Then, by alternately opening/closing the open/close valve 18 provided in the circulation path 15 and the open/close valve 21 provided in the bypass flow path 20, it is possible to form any one of a circulating flow flowing through the filter 19, and a circulating flow bypassing the filter 19.

The silicon solution supply 25 supplies the silicon solution to the mixture liquid M generated by the mixing device 10. The silicon solution according to the embodiment is a solution in which, for example, colloidal silicon is dispersed. The silicon solution supply 25 includes a silicon solution supply source 25a, a silicon solution supply path 25b, and a flow rate regulator 25c.

The silicon solution supply source 25a is, for example, a tank that stores the silicon solution. The flow rate regulator 25c is provided in the silicon solution supply path 25b, and adjusts the flow rate of the silicon solution flowing through the silicon solution supply path 25b. The flow rate regulator 25c is constituted by, for example, an open/close valve, a flow rate control valve, or a flow meter.

Here, in the embodiment, the silicon solution supply path 25b of the silicon solution supply 25 is connected to a junction 22a provided in the liquid sending path 22. That is, in the embodiment, after the mixture liquid M is generated by the mixing device 10, the silicon solution may be individually supplied to the generated mixture liquid M to generate the etching liquid E.

Accordingly, it is possible to adjust the silicon concentration in the mixture liquid M to be supplied to the substrate processor 30, in a wide range. Next, a method of adjusting the silicon concentration in the mixture liquid M will be described with reference to FIG. 2 and FIG. 3.

Figure 2:
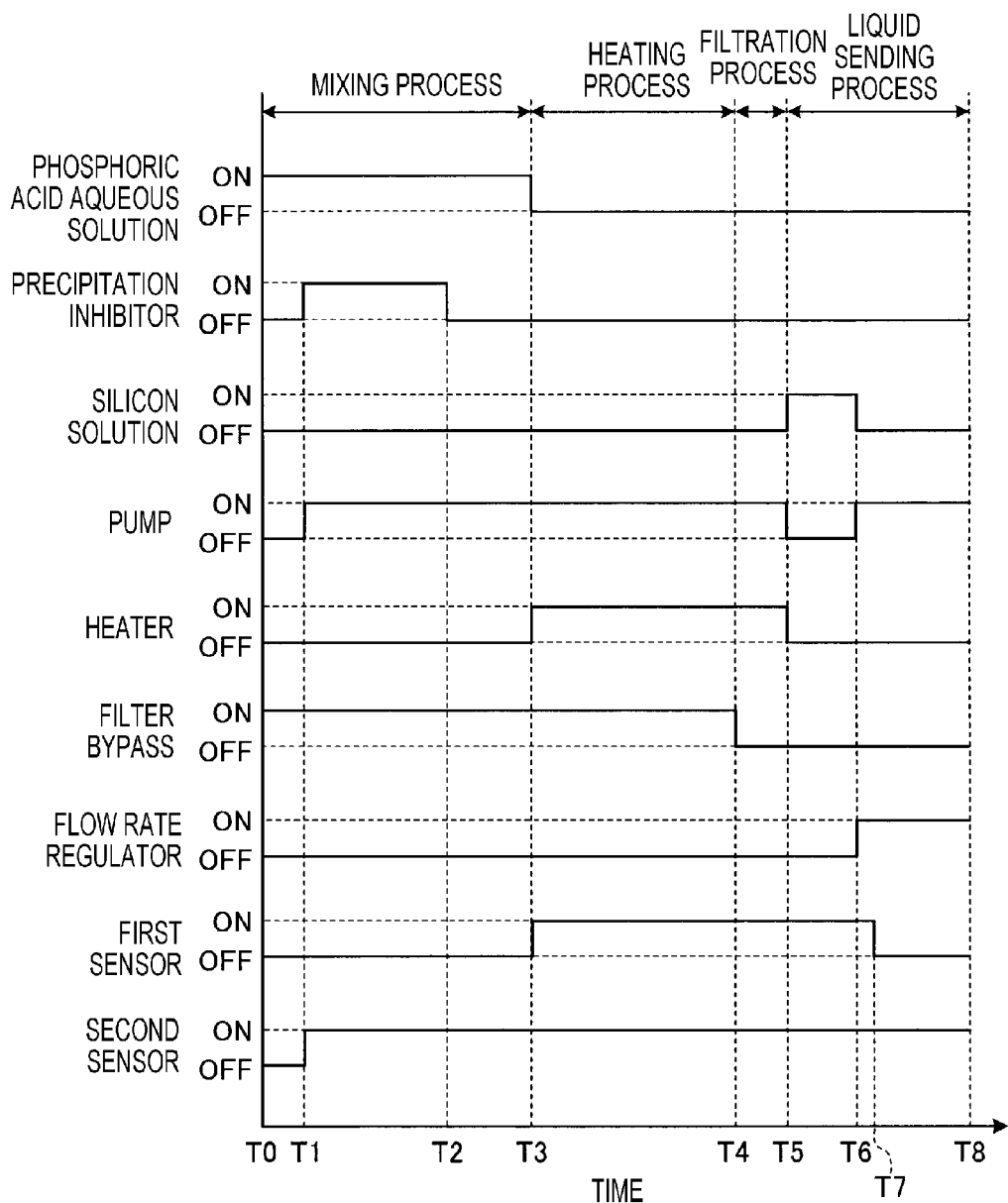
FIG. 2 is a timing chart illustrating a specific example of a behavior pattern of each unit in the substrate processing system, during various processes when a mixture liquid is initially sent to a processing bath according to the embodiment.

FIG. 2 is a timing chart illustrating a specific example of a behavior pattern of each unit in the substrate processing system 1, during various processes when the mixture liquid M is initially sent to the processing bath 31 according to the embodiment. Each unit of the substrate processing system 1 is controlled by a controller (not illustrated) provided in the substrate processing system 1.

Such a controller controls the operation of each unit (for example, the mixing device 10 or the substrate processor 30) of the substrate processing system 1 illustrated in FIG. 1. The controller controls the operation of each unit of the substrate processing system 1 based on signals from, for example, a switch or various sensors.

The controller is, for example, a computer, and has a computer-readable storage medium (not illustrated). Such a storage medium stores a program that controls various processes to be executed in the substrate processing system 1.

The controller controls the operation of the substrate processing system 1, by reading and executing the program stored in the storage medium. The program, which is stored in the computer-readable storage medium, may have been installed from another storage medium to the storage medium of the controller.

Examples of the computer-readable storage medium include a hard disk (HD), a flexible disk (FD), a compact disc (CD), a magneto-optical disk (MO), and a memory card.

As illustrated in FIG. 2, in the embodiment, a mixing process, a heating process, a filtration process, and a liquid sending process are sequentially performed. First, the controller starts the mixing process by operating (turning ON) the phosphoric acid aqueous solution supply 11 from time T0, and supplying the phosphoric acid aqueous solution to the tank 14.

At this point in time T0, the precipitation inhibitor supply 12, the silicon solution supply 25, the pump 16, and the heater 17 are not operating (OFF state). At the point in time T0, since the open/close valve 18 is in a close state and the open/close valve 21 is in an open state, in this state, the filter 19 is bypassed by the bypass flow path 20 (a filter bypass is in an ON state).

At the point in time T0, the flow rate regulator 23 is in a close state (OFF state), and OFF signals are output from the first liquid level sensor S1 and the second liquid level sensor S2 since nothing is stored in the tank 14.

Then, the liquid level of the phosphoric acid aqueous solution stored in the tank 14 gradually rises. When the liquid level becomes equal to or higher than a predetermined second height at time T1, an ON signal is output from the second liquid level sensor S2.

Then, the controller supplies the precipitation inhibitor to the tank 14 by operating (turning ON) the precipitation inhibitor supply 12 from time T1. The controller forms a circulating flow in the circulation path 15 by operating (turning ON) the pump 16 from time T1.

Next, at time T2 when the precipitation inhibitor has been supplied in a predetermined amount to the tank 14, the controller stops (turns OFF) the precipitation inhibitor supply 12.

Next, at time T3, when the liquid level of the mixture liquid M becomes equal to or higher than a predetermined first height, an ON signal is output from the first liquid level sensor S1. Then, the controller considers that the phosphoric acid aqueous solution has been supplied in a predetermined amount to the tank 14, and stops (turns OFF) the phosphoric acid aqueous solution supply 11 at time T3. Accordingly, the mixing process is completed.

Next, the controller starts the heating process by operating (turning ON) the heater 17 from time T3, and heating the mixture liquid M circulating in the circulation path 15. The controller heats the mixture liquid M by the heater 17, thereby heating the mixture liquid M stored in the tank 14.

In the embodiment, the liquid volume of, for example, the phosphoric acid aqueous solution is measured by using, for example, the first liquid level sensor S1, but, in some cases, a temperature change of the stored mixture liquid M may adversely affect the accuracy of measurement.

Therefore, in the embodiment, the heating process is started from the point in time (time T3) when the measurement of, for example, the phosphoric acid aqueous solution is completed, and the mixing process is completed. Accordingly, it is possible to satisfactorily maintain the measurement accuracy of, for example, the phosphoric acid aqueous solution.

Next, at time T4 when the mixture liquid M within the tank 14 is heated to a predetermined temperature (for example, less than 100° C.), the heating process is completed. As described above, in the embodiment, it is possible to supply the heated mixture liquid M to the substrate processor 30 by providing the heater 17 that performs the heating process, in the mixing device 10.

In the embodiment, it is possible to efficiently heat the mixture liquid M by providing the heater 17 in the circulation path 15 of the mixing device 10.

In the substrate processing according to the embodiment, the heating process starts after the mixing process is completed. This is because if the precipitation inhibitor containing an organic solvent is supplied to the phosphoric acid aqueous solution whose temperature has risen by heating, there is a concern that such a precipitation inhibitor may be bumped.

That is, according to the embodiment, it is possible to suppress the precipitation inhibitor from being bumped during the supply by starting the heating process after the mixing process is completed.

Next, the controller starts the filtration process by turning OFF the filter bypass from time T4. That is, from time T4, the controller changes the open/close valve 18 to an open state and changes the open/close valve 21 to a close state, so as to form a circulating flow flowing through the filter 19, in the circulation path 15. Accordingly, contaminants such as particles contained in the mixture liquid M are removed.

Then, the filtration process is completed at time T5 when the contaminants such as particles contained in the mixture liquid M are sufficiently removed.

In the substrate processing according to the embodiment, the filter bypass is turned ON in the mixing process and the heating process. Accordingly, since in the circulation path 15, a pressure loss occurring in the filter 19 may be reduced, it is possible to efficiently circulate the mixture liquid M stored in the tank 14.

Since there is no need to filter the mixture liquid M with the filter 19 until the heating process is completed, there is no particular problem even if the mixture liquid M is circulated through the bypass flow path 20.

Next, the controller starts the liquid sending process from time T5.

Specifically, the controller sends the silicon solution to the processing bath 31 of the substrate processor 30 through the liquid sending path 22 by operating (turning ON) the silicon solution supply 25 from time T5.

The controller stops (turns OFF) the pump 16 at the same timing (time T5) as the supply start of the silicon solution. Accordingly, it is possible to suppress the mixture liquid M from flowing backward from the liquid sending path 22 to the silicon solution supply 25 due to a high pressure from the pump 16.

The controller stops (turns OFF) the heater 17 at the same timing (time T5) as the supply start of the silicon solution. Accordingly, it is possible to suppress the temperature of the mixture liquid M from becoming higher than the predetermined temperature (for example, less than 100° C.).

Next, at time T6 when the silicon solution has been supplied in a predetermined amount to the processing bath 31, the controller stops (turns OFF) the silicon solution supply 25. Then, the controller operates (turns ON) the pump 16, and places (turns ON) the flow rate regulator 23 in an open state, at the same timing (time T6) as the supply stop of the silicon solution.

Accordingly, the controller sends the mixture liquid M from the mixing device 10 to the processing bath 31 of the substrate processor 30 through the circulation path 15 and the liquid sending path 22. Then, the mixture liquid M within the tank 14 is reduced, and the liquid level becomes lower than the predetermined first height at time T7.

Accordingly, an OFF signal is output from the first liquid level sensor S1. Then, at time T8 when the mixture liquid M has been sent in a predetermined amount, the liquid sending process is completed.

Through the processes described so far, the controller may store the etching liquid E having a desired silicon concentration, in the processing bath 31 when initially sending the mixture liquid M to the processing bath 31. Therefore, according to the embodiment, from the point in time when an etching processing on the wafer W is started, it is possible to improve the etching selectivity of the silicon nitride film to the silicon oxide film.

Figure 3:
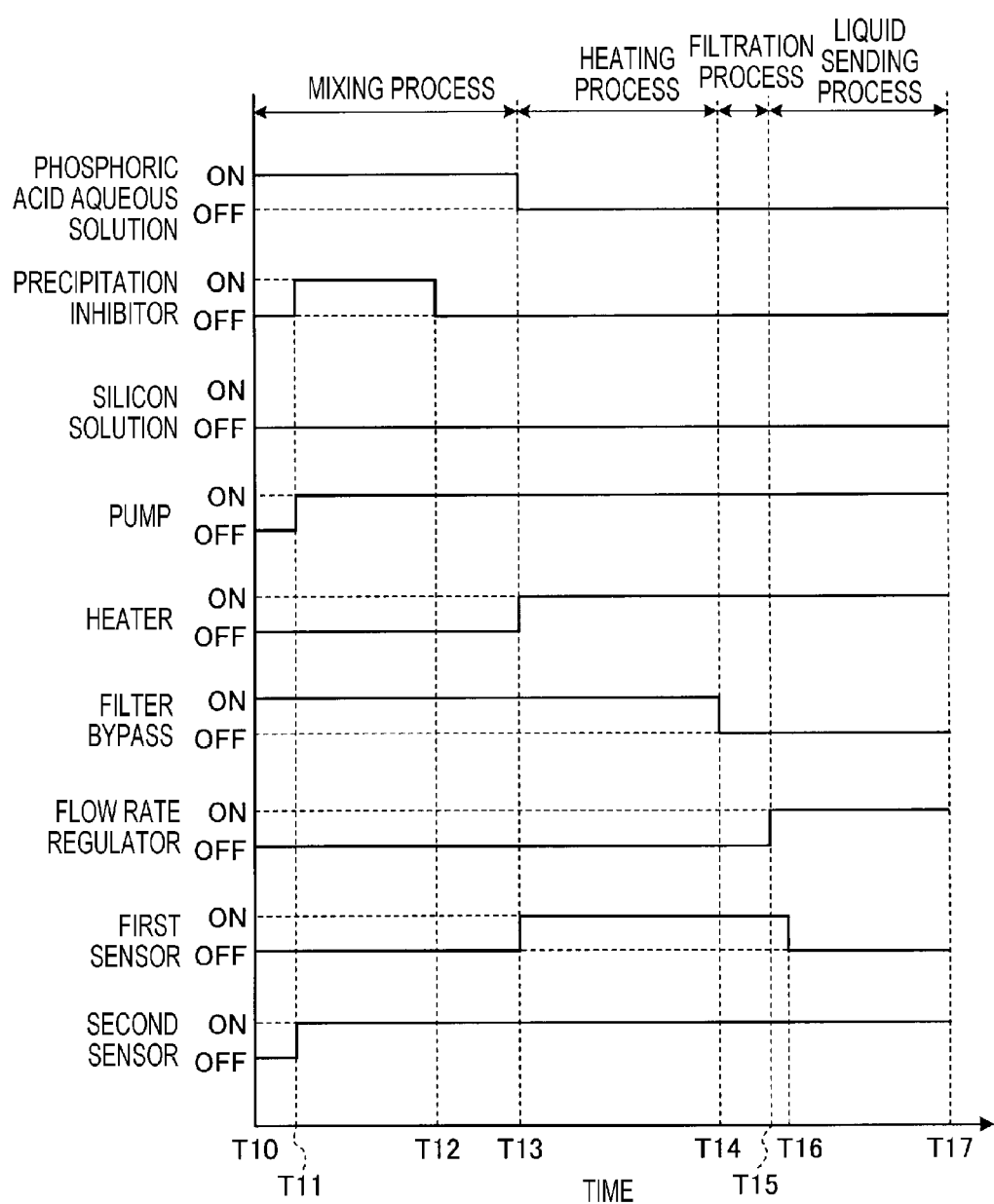
FIG. 3 is a timing chart illustrating a specific example of a behavior pattern of each unit in the substrate processing system, during various processes when the silicon concentration of an etching liquid is adjusted in the processing bath according to the embodiment.

FIG. 3 is a timing chart illustrating a specific example of a behavior pattern of each unit in the substrate processing system 1, during various processes when the silicon concentration of the etching liquid E is adjusted in the processing bath 31 according to the embodiment.

In FIG. 3, descriptions will be made on a mixing process to a liquid sending process of the mixture liquid M to be sent when silicon is eluted into the etching liquid E from the wafer W after the etching processing on the wafer W is started in the processing bath 31.

First, the controller starts the mixing process by operating (turning ON) the phosphoric acid aqueous solution supply 11 from time T10, and supplying the phosphoric acid aqueous solution to the tank 14.

At this point in time T10, the precipitation inhibitor supply 12, the silicon solution supply 25, the pump 16, and the heater 17 are not operating (OFF state). At the point in time T10, since the open/close valve 18 is in a close state and the open/close valve 21 is in an open state, in this state, the filter 19 is bypassed by the bypass flow path 20 (the filter bypass is in an ON state).

At the point in time T10, the flow rate regulator 23 is in a close state (OFF state), and OFF signals are output from the first liquid level sensor S1 and the second liquid level sensor S2 since the amount of the mixture liquid M has been reduced within the tank 14 by the previous liquid sending process.

Then, the liquid level of the phosphoric acid aqueous solution stored in the tank 14 gradually rises. When the liquid level becomes equal to or higher than the predetermined second height at time T11, an ON signal is output from the second liquid level sensor S2.

Then, the controller supplies the precipitation inhibitor to the tank 14 by operating (turning ON) the precipitation inhibitor supply 12 from time T11. The controller forms a circulating flow in the circulation path 15 by operating (turning ON) the pump 16 from time T11.

Next, at time T12 when the precipitation inhibitor has been supplied in a predetermined amount to the tank 14, the controller stops (turns OFF) the precipitation inhibitor supply 12.

Next, at time T13, when the liquid level of the mixture liquid M becomes equal to or higher than the predetermined first height, an ON signal is output from the first liquid level sensor S1. Then, the controller considers that the phosphoric acid aqueous solution has been supplied in a predetermined amount to the tank 14, and stops (turns OFF) the phosphoric acid aqueous solution supply 11 at time T13.

Next, the controller starts the heating process by operating (turning ON) the heater 17 from time T13, and heating the mixture liquid M circulating in the circulation path 15. The controller heats the mixture liquid M by the heater 17, thereby heating the mixture liquid M stored in the tank 14.

Next, at time T14 when the mixture liquid M within the tank 14 is heated to a predetermined temperature (for example, about 165° C.), the heating process is completed.

Next, the controller starts the filtration process by turning OFF the filter bypass from time T14. Accordingly, contaminants such as particles contained in the mixture liquid M are removed.

Then, the filtration process is completed at time T15 when the contaminants such as particles contained in the mixture liquid M are sufficiently removed.

Next, the controller starts the liquid sending process from time T15. Specifically, the controller places (turns ON) the flow rate regulator 23 in an open state at time T15.

Accordingly, the controller sends the mixture liquid M from the mixing device 10 to the processing bath 31 of the substrate processor 30 through the circulation path 15 and the liquid sending path 22. Then, the mixture liquid M within the tank 14 is reduced, and the liquid level becomes lower than the predetermined first height at time T16.

Accordingly, an OFF signal is output from the first liquid level sensor S1. Then, at time T17 when the mixture liquid M has been sent in a predetermined amount, the liquid sending process is completed.

Through the processes described so far, the controller may supply the mixture liquid M that does not contain the silicon solution, to the processing bath 31. Accordingly, when silicon is eluted from the silicon nitride film within the wafer W and the silicon concentration in the etching liquid E becomes excessive, it is possible to quickly suppress the silicon concentration in the etching liquid E to a predetermined concentration.

As described above, in the embodiment, the silicon solution may be individually supplied to the generated mixture liquid M to generate the etching liquid E. Thus, it is possible to adjust the silicon concentration in the mixture liquid M to be supplied to the substrate processor 30, in a wide range.

That is, when a predetermined silicon concentration is required for the mixture liquid M (for example, when the liquid is initially sent), it is possible to supply the mixture liquid M containing the silicon solution, to the processing bath 31 by operating the silicon solution supply 25.

Meanwhile, when a predetermined silicon concentration is not required for the mixture liquid M (for example, when the silicon concentration is adjusted), it is possible to supply the mixture liquid M not containing the silicon solution to the processing bath 31 by not operating the silicon solution supply 25.

In the embodiment, the liquid sending path 22 is provided diverging from the circulation path 15. Accordingly, the mixture liquid M may be sent to the processing bath 31 by the pump 16 used at the time of the mixing process or the heating process. That is, in the embodiment, since there is no need to provide a separate pump in the liquid sending path 22 for the purpose of the liquid sending process of the mixture liquid M, it is possible to send the mixture liquid M at a low cost.

In the embodiment, by controlling the heater 17, the temperature of the mixture liquid M may be set based on whether to supply the silicon solution to the mixture liquid M. For example, when the silicon solution is supplied to the mixture liquid M (for example, when the liquid is initially sent), the mixture liquid M is heated to a temperature less than 100° C. while when the silicon solution is not supplied to the mixture liquid M (for example, when the silicon concentration is adjusted), the mixture liquid M is heated to a temperature of about 165° C.

Accordingly, when the silicon solution is supplied to the mixture liquid M, it is possible to suppress the silicon solution containing moisture from being exposed to a high temperature and being bumped. When the silicon solution is not supplied to the mixture liquid M, it is possible to suppress the temperature of the etching liquid E during the processing from being reduced due to the supply of the mixture liquid M.

Referring back to FIG. 1, descriptions on other portions in the substrate processing system 1 will be continued. The substrate processor 30 performs the etching processing on the wafer W by immersing the wafer W in the etching liquid E generated by the mixing device 10.

The substrate processor 30 includes the processing bath 31, a circulation path 32, a DIW supply 33, and an etching liquid drainage section 34. The processing bath 31 includes the inner tank 31a and the outer tank 31b.

The top portion of the inner tank 31a is open, and the etching liquid E is supplied to the vicinity of the top portion. In the inner tank 31a, a plurality of wafers W is immersed in the etching liquid E by a substrate lift mechanism 35, and the etching processing is performed on the wafers W. The substrate lift mechanism 35 is configured to be movable up and down, and holds the wafers W aligned in the front and rear direction in a vertical posture.

The outer tank 31b is provided around the top portion of the inner tank 31a, and the top portion thereof is open. Into the outer tank 31b, the etching liquid E overflowing from the inner tank 31a flows.

To the inner tank 31a and the outer tank 31b, the mixture liquid M is supplied from the mixing device 10 through the liquid sending path 22, and the silicon solution is supplied from the silicon solution supply 25 through the liquid sending path 22. To the outer tank 31b, deionized water (DIW) is supplied from the DIW supply 33.

The DIW supply 33 includes a DIW supply source 33a, a DIW supply path 33b, and a flow rate regulator 33c. The DIW supply 33 supplies DIW to the outer tank 31b for the purpose of replenishment of moisture evaporated from the heated etching liquid E.

The DIW supply path 33b connects the DIW supply source 33a to the outer tank 31b, and supplies DIW at a predetermined temperature from the DIW supply source 33a to the outer tank 31b.

The flow rate regulator 33c is provided in the DIW supply path 33b, and adjusts a supply amount of DIW to be supplied to the outer tank 31b. The flow rate regulator 33c is constituted by, for example, an open/close valve, a flow rate control valve, or a flow meter. By adjusting the supply amount of DIW by the flow rate regulator 33c, the temperature, the phosphoric acid concentration, the silicon concentration, and the precipitation inhibitor concentration, in the etching liquid E, are adjusted.

A temperature sensor 36 and a phosphoric acid concentration sensor 37 are provided in the outer tank 31b. The temperature sensor 36 detects the temperature of the etching liquid E, and the phosphoric acid concentration sensor 37 detects the phosphoric acid concentration of the etching liquid E. Signals generated by the temperature sensor 36 and the phosphoric acid concentration sensor 37 are transmitted to the above described controller.

The outer tank 31b and the inner tank 31a are connected by the circulation path 32. One end of the circulation path 32 is connected to the bottom of the outer tank 31b, and the other end of the circulation path 32 is connected to a processing liquid supply nozzle 38 provided in the inner tank 31a.

The circulation path 32 is provided with a pump 39, a heater 40, a filter 41, and a silicon concentration sensor 42 in order from the outer tank 31b side.

The pump 39 forms a circulating flow of the etching liquid E sent from the outer tank 31b to the inner tank 31a through the circulation path 32. The etching liquid E flows out to the outer tank 31b again by overflowing from the inner tank 31a. In this manner, the circulating flow of the etching liquid E is formed within the substrate processor 30. That is, such a circulating flow is formed in the outer tank 31b, the circulation path 32, and the inner tank 31a.

The heater 40 adjusts the temperature of the etching liquid E circulating in the circulation path 32. The filter 41 filters the etching liquid E circulating in the circulation path 32. The silicon concentration sensor 42 detects the silicon concentration in the etching liquid E circulating in the circulation path 32. A signal generated by the silicon concentration sensor 42 is transmitted to the controller.

The etching liquid drainage section 34 discharges the etching liquid E containing the silicon solution to a drainage DR, when the whole or a part of the etching liquid E used for the etching processing is replaced. The etching liquid drainage section 34 includes a discharge path 34a, a flow rate regulator 34b, and a cooling tank 34c.

The discharge path 34a is connected to the circulation path 32. The flow rate regulator 34b is provided in the discharge path 34a, and adjusts a discharge amount of the etching liquid E to be discharged. The flow rate regulator 34b is constituted by, for example, an open/close valve, a flow rate control valve, or a flow meter.

The cooling tank 34c temporarily stores and cools the etching liquid E flowing through the discharge path 34a. In the cooling tank 34c the discharge amount of the etching liquid E is adjusted by the flow rate regulator 34b.

<Modifications>

Figure 4:
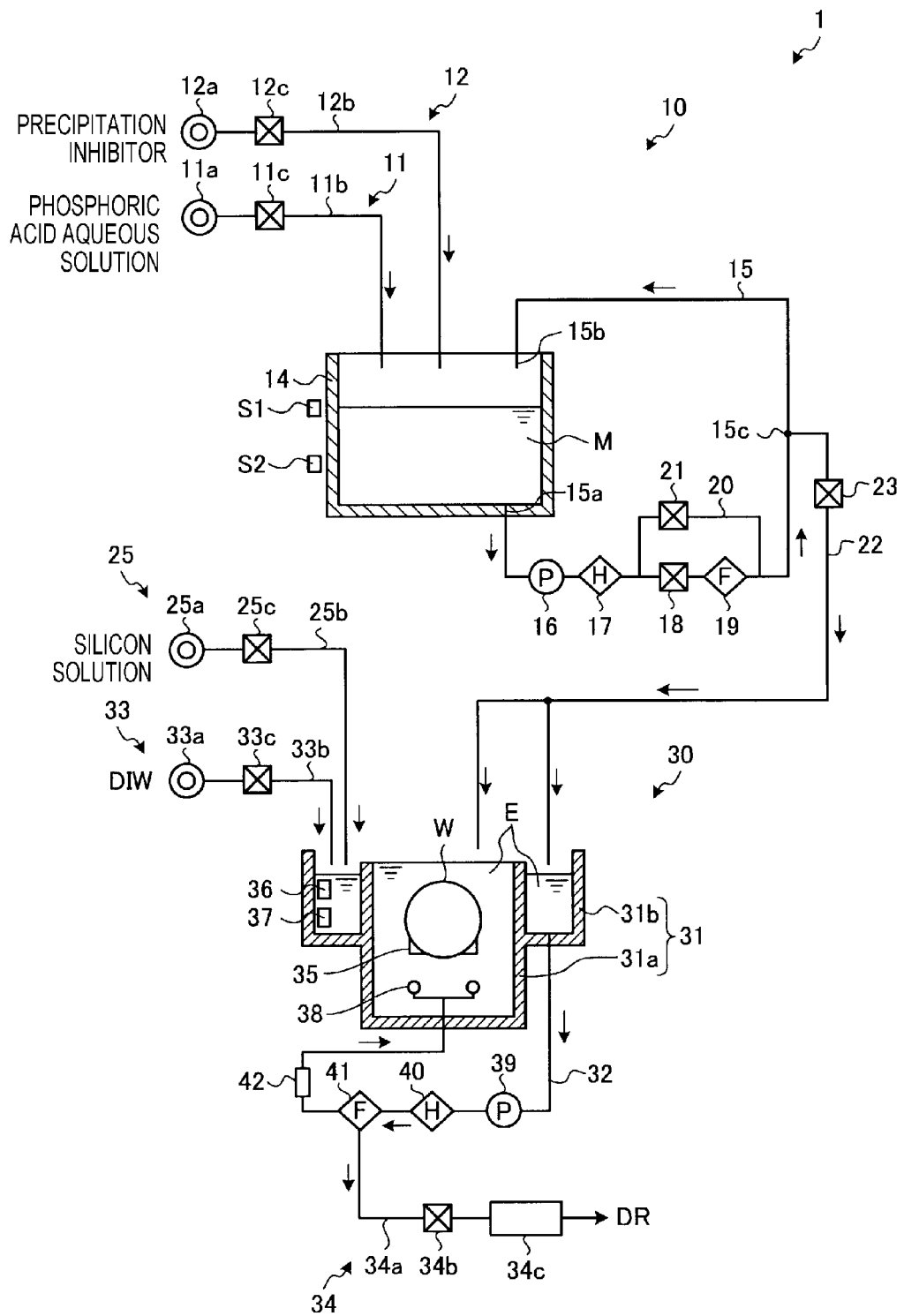
FIG. 4 is a schematic block diagram illustrating a configuration of the substrate processing system according to a first modification of the embodiment.

Next, descriptions will be made on various modifications of the substrate processing system 1 according to the embodiment with reference to FIG. 4 to FIG. 14. FIG. 4 is a schematic block diagram illustrating a configuration of the substrate processing system 1 according to a first modification of the embodiment. In the following various modifications, the same portions as those in the embodiment are denoted by the same reference numerals, and thus redundant descriptions thereof will be omitted.

As illustrated in FIG. 4, in the substrate processing system 1 according to the first modification, the configuration of the silicon solution supply 25 is different from that in the embodiment. Specifically, the silicon solution supply path 25b of the silicon solution supply 25 is connected to the processing bath 31 instead of the liquid sending path 22. For example, the silicon solution supply path 25b is connected to the outer tank 31b of the processing bath 31.

In the first modification as well, the silicon solution may be individually supplied to the mixture liquid M generated by the mixing device 10 to generate the etching liquid E.

Figure 5:
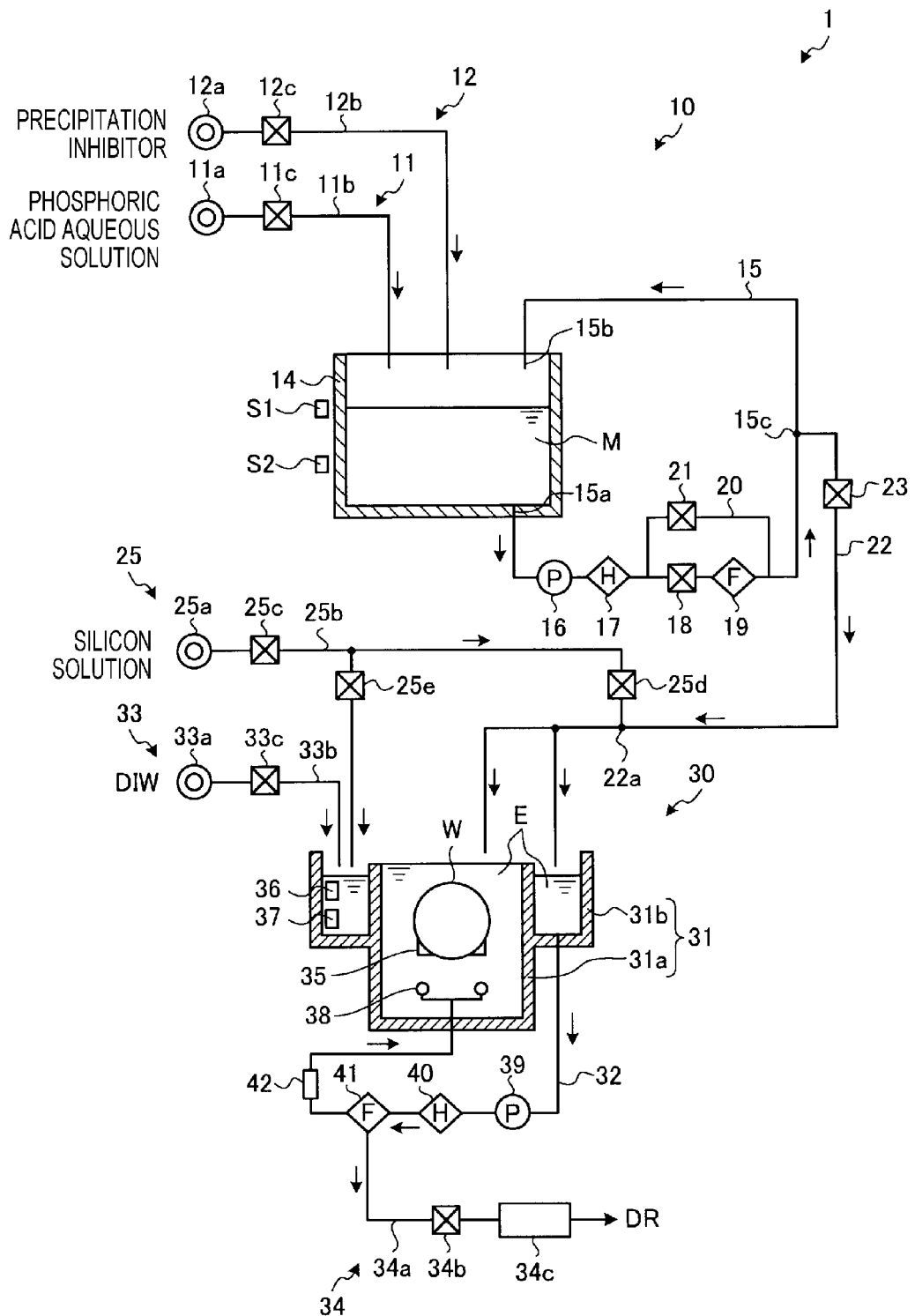
FIG. 5 is a schematic block diagram illustrating a configuration of the substrate processing system according to a second modification of the embodiment.

FIG. 5 is a schematic block diagram illustrating a configuration of the substrate processing system 1 according to a second modification of the embodiment. As illustrated in FIG. 5, in the substrate processing system 1 according to the second modification, the silicon solution supply path 25b of the silicon solution supply 25 is connected to both the liquid sending path 22 and the processing bath 31.

For example, the silicon solution supply path 25b is connected to the junction 22a of the liquid sending path 22 and is also connected to the outer tank 31b of the processing bath 31.

A flow rate regulator 25d is provided in the silicon solution supply path 25b connected to the junction 22a of the liquid sending path 22, and a flow rate regulator 25e is provided in the silicon solution supply path 25b connected to the processing bath 31.

Then, by controlling these flow rate regulators 25d and 25e, the silicon solution may be individually supplied to each part of the mixture liquid M generated by the mixing device 10 to generate the etching liquid E.

Figure 6:
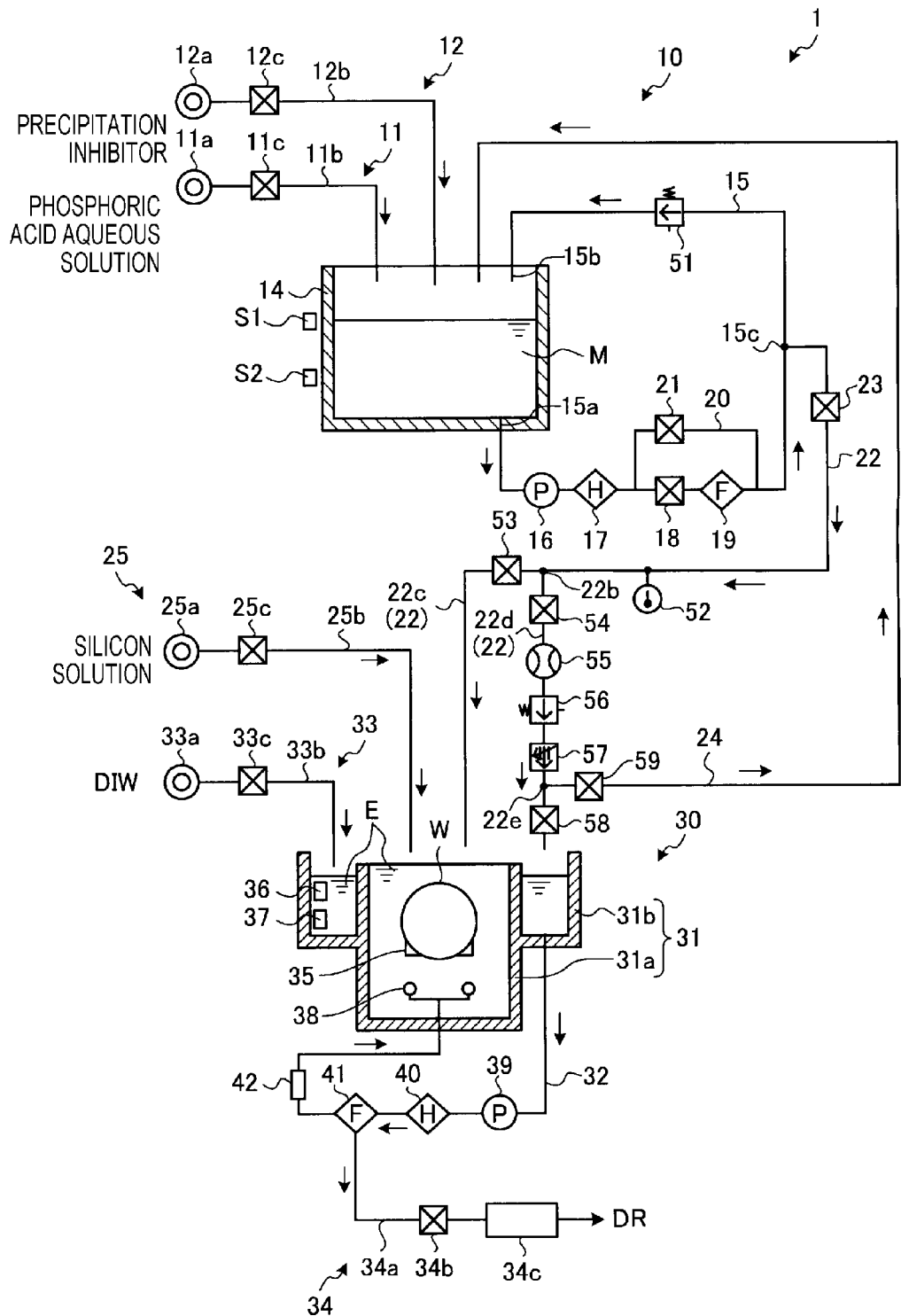
FIG. 6 is a schematic block diagram illustrating a configuration of the substrate processing system according to a third modification of the embodiment.

FIG. 6 is a schematic block diagram illustrating a configuration of the substrate processing system 1 according to a third modification of the embodiment. The substrate processing system 1 according to the third modification is provided with a function for always maintaining the silicon concentration of the etching liquid E within the processing bath 31 at a constant level or less when silicon is eluted into the etching liquid E from the wafer W after the etching processing on the wafer W is started in the processing bath 31.

Then, in order to provide such a function, a part of the configuration is different from that of the above described first modification. A specific difference in the configuration will be described below.

As illustrated in FIG. 6, in the third modification, a back pressure valve 51 is provided on the downstream side of the diverging portion 15c in the circulation path 15. The back pressure valve 51 adjusts the pressure in the circulation path 15 on the upstream side of the back pressure valve 51 (for example, the diverging portion 15c).

A thermometer 52 is provided on the upstream side of a diverging portion 22b in the liquid sending path 22. Such a thermometer 52 measures the temperature of the mixture liquid M flowing through the liquid sending path 22. The diverging portion 22b is a portion in the liquid sending path 22, from which a liquid sending path 22c connected to the inner tank 31a and a liquid sending path 22d connected to the outer tank 31b diverge. That is, the liquid sending path 22c and the liquid sending path 22d are a part of the liquid sending path 22.

A valve 53 is provided in the liquid sending path 22c, and the liquid sending path 22d is provided with a valve 54, a flow meter 55, a constant pressure valve 56, a throttle valve 57, a diverging portion 22e, and a valve 58 in order from the upstream side. From the diverging portion 22e, a return path 24 that returns the mixture liquid M to the tank 14 diverges. Such a return path 24 has a valve 59.

The silicon solution supply path 25b of the silicon solution supply 25 is connected to the inner tank 31a of the processing bath 31.

The controller alternately opens/closes the valve 53 and the valve 54. Accordingly, the controller may send the mixture liquid M while switching between the inner tank 31a and the outer tank 31b.

The flow meter 55 measures the flow rate of the mixture liquid M flowing through the liquid sending path 22d. Here, in the third modification, the flow meter 55 may correct the flow rate of the mixture liquid M based on the temperature of the mixture liquid M measured by the thermometer 52. For example, the controller may correct the flow rate information of the mixture liquid M obtained from the flow meter 55 based on the temperature information of the mixture liquid M obtained from the thermometer 52.

Accordingly, in the third modification, even when the temperature of the mixture liquid M is significantly changed in a range from a room temperature to a high temperature, it is possible to accurately measure the flow rate of the mixture liquid M flowing through the flow meter 55.

The constant pressure valve 56 adjusts the pressure in the liquid sending path 22d on the downstream side of the constant pressure valve 56. The throttle valve 57 adjusts the flow rate of the mixture liquid M flowing through the liquid sending path 22d.

The controller alternately opens/closes the valve 58 and the valve 59. Accordingly, the controller may send the mixture liquid M while switching between the outer tank 31b and the tank 14.

Figure 7:
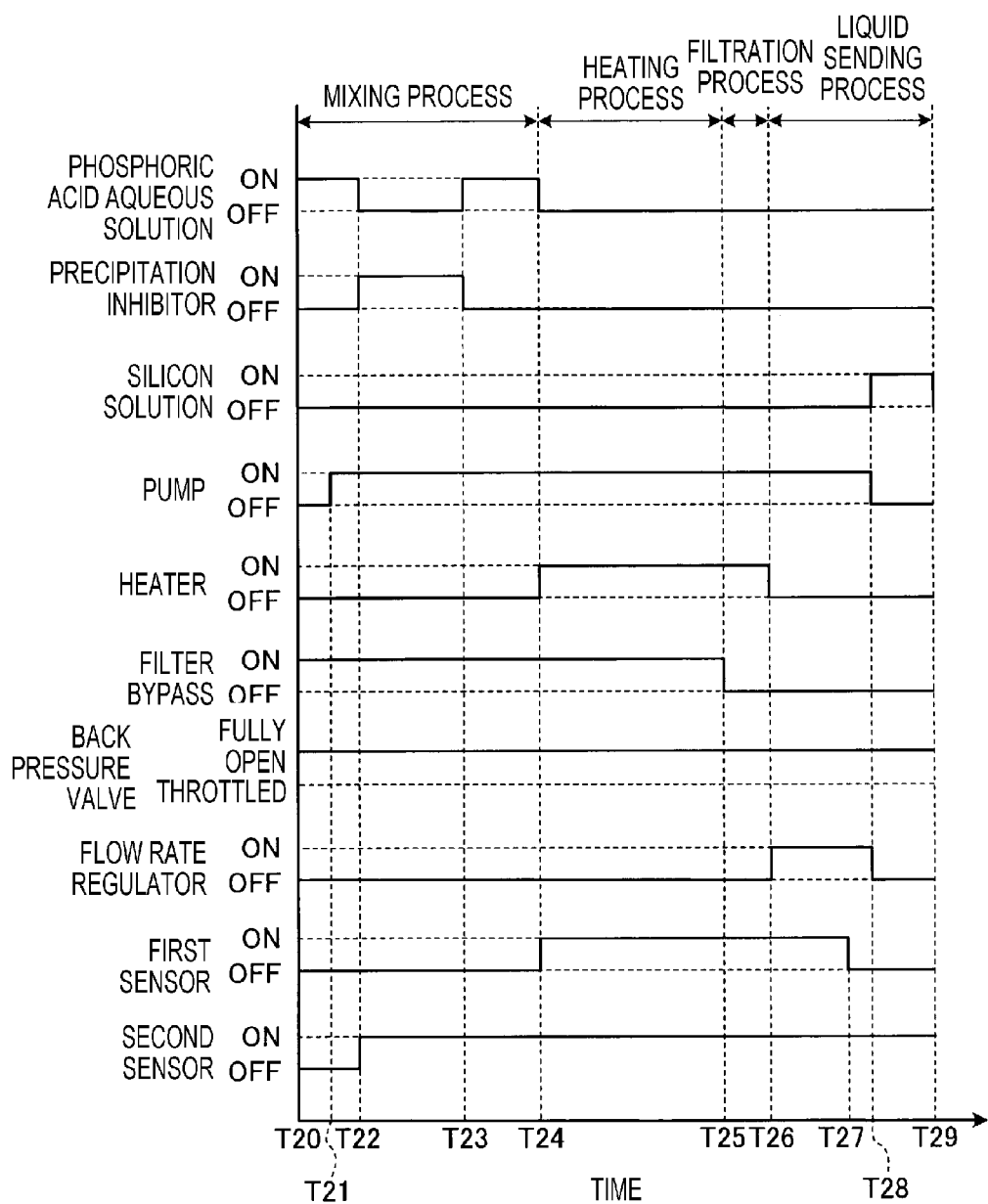
FIG. 7 is a timing chart illustrating a specific example of a behavior pattern of each unit in the substrate processing system, during various processes when the mixture liquid is initially sent to the processing bath according to the third modification of the embodiment.

Next, a method of adjusting the silicon concentration in the mixture liquid M in the third modification will be described with reference to FIG. 7 and FIG. 8. FIG. 7 is a timing chart illustrating a specific example of a behavior pattern of each unit in the substrate processing system 1, during various processes when the mixture liquid M is initially sent to the processing bath 31 according to the third modification of the embodiment.

As illustrated in FIG. 7, in the third modification, a mixing process, a heating process, a filtration process, and a liquid sending process are sequentially performed. First, the controller starts the mixing process by operating (turning ON) the phosphoric acid aqueous solution supply 11 from time T20, and supplying the phosphoric acid aqueous solution to the tank 14.

At this point in time T20, the precipitation inhibitor supply 12, the silicon solution supply 25, the pump 16, and the heater 17 are not operating (OFF state). At the point in time T20, since the open/close valve 18 is in a close state and the open/close valve 21 is in an open state, in this state, the filter 19 is bypassed by the bypass flow path 20 (a filter bypass is in an ON state), and the back pressure valve 51 is in a fully open state.

At point in time T20, the flow rate regulator 23 is in a close state (OFF state), and OFF signals are output from the first liquid level sensor S1 and the second liquid level sensor S2 since nothing is stored in the tank 14.

Then, at time T21 when the phosphoric acid aqueous solution has been supplied in a predetermined amount to the tank 14, the controller forms a circulating flow in the circulation path 15 by operating (turning ON) the pump 16.

Next, the liquid level of the phosphoric acid aqueous solution stored in the tank 14 gradually rises. When the liquid level becomes equal to or higher than the predetermined second height at time T22, an ON signal is output from the second liquid level sensor S2. Then, the controller supplies the precipitation inhibitor to the tank 14 by operating (turning ON) the precipitation inhibitor supply 12 from time T22, and stops (turns OFF) the phosphoric acid aqueous solution supply 11.

Next, at time T23 when the precipitation inhibitor has been supplied in a predetermined amount to the tank 14, the controller stops (turns OFF) the precipitation inhibitor supply 12, and supplies the phosphoric acid aqueous solution to the tank 14 by operating (turning ON) the phosphoric acid aqueous solution supply 11.

Next, at time T24, when the liquid level of the mixture liquid M becomes equal to or higher than the predetermined first height, an ON signal is output from the first liquid level sensor S1. Then, the controller considers that the phosphoric acid aqueous solution has been supplied in a predetermined amount to the tank 14, and stops (turns OFF) the phosphoric acid aqueous solution supply 11 at time T24. Accordingly, the mixing process is completed.

As described above, in the third modification, the controller operates the pump 16 before the precipitation inhibitor is supplied to the tank 14. Accordingly, the circulating flow may be formed in the circulation path 15 before the precipitation inhibitor is supplied, and thus, it is possible to improve a mixing property between the phosphoric acid aqueous solution and the precipitation inhibitor.

In the third modification, the controller does not simultaneously supply the phosphoric acid aqueous solution and the precipitation inhibitor to the tank 14, but individually supplies each to the tank 14. Accordingly, it is possible to suppress the output of an ON signal from the first liquid level sensor S1 before the precipitation inhibitor is supplied in a predetermined amount. Therefore, according to the third modification, it is possible to reliably supply the precipitation inhibitor in a predetermined amount to the tank 14.

Next, the controller starts the heating process by operating (turning ON) the heater 17 from time T24, and heating the mixture liquid M circulating in the circulation path 15. The controller heats the mixture liquid M by the heater 17, thereby heating the mixture liquid M stored in the tank 14.

Next, at time T25 when the mixture liquid M within the tank 14 is heated to a predetermined temperature (for example, less than 100° C.), the heating process is completed.

Next, the controller starts the filtration process by turning OFF the filter bypass from time T25. That is, from time T25, the controller changes the open/close valve 18 to an open state and changes the open/close valve 21 to a close state so as to form a circulating flow flowing through the filter 19, in the circulation path 15. Accordingly, contaminants such as particles contained in the mixture liquid M are removed.

Then, the filtration process is completed at time T26 when the contaminants such as particles contained in the mixture liquid M are sufficiently removed.

Next, the controller starts the liquid sending process from time T26. Specifically, the controller places (turns ON) the flow rate regulator 23 in an open state from time T26.

Although not illustrated in FIG. 7, the controller changes the valve 53 to an open state and changes the valve 54 to a close state.

Accordingly, the controller sends the mixture liquid M from the mixing device 10 to the inner tank 31a of the substrate processor 30 through the circulation path 15, the liquid sending path 22, and the liquid sending path 22c.

Then, the mixture liquid M within the tank 14 is reduced, and the liquid level becomes lower than the predetermined first height at time T27. Accordingly, an OFF signal is output from the first liquid level sensor 51.

The controller stops (turns OFF) the heater 17 at the same timing (time T26) as the liquid sending start of the mixture liquid M. Accordingly, it is possible to suppress the temperature of the mixture liquid M from becoming higher than the predetermined temperature (for example, less than 100° C.).

Next, at time T28 when the mixture liquid M has been supplied in a predetermined amount to the processing bath 31, the controller operates (turns ON) the silicon solution supply 25, and places (turns OFF) the flow rate regulator 23 in a close state. Accordingly, the controller sends the silicon solution to the inner tank 31a of the substrate processor 30 through the silicon solution supply path 25b.

The controller stops (turns OFF) the pump 16 at the same timing (time T28) as the supply start of the silicon solution. Then, at time T29 when the silicon solution has been sent in a predetermined amount, the liquid sending process is completed.

Through the processes described so far, the controller may store the etching liquid E having a desired silicon concentration, in the processing bath 31 when initially sending the mixture liquid M to the processing bath 31. Therefore, according to the third modification, from the point in time when an etching processing on the wafer W is started, it is possible to improve the etching selectivity of the silicon nitride film to the silicon oxide film.

In the third modification, the controller supplies both the mixture liquid M and the silicon solution to the inner tank 31a of the processing bath 31. Accordingly, in the third modification, the mixture liquid M and the silicon solution may be mixed while overflowing from the inner tank 31a to the outer tank 31b. Thus, it is possible to improve the mixing property between the mixture liquid M and the silicon solution.

Figure 8:
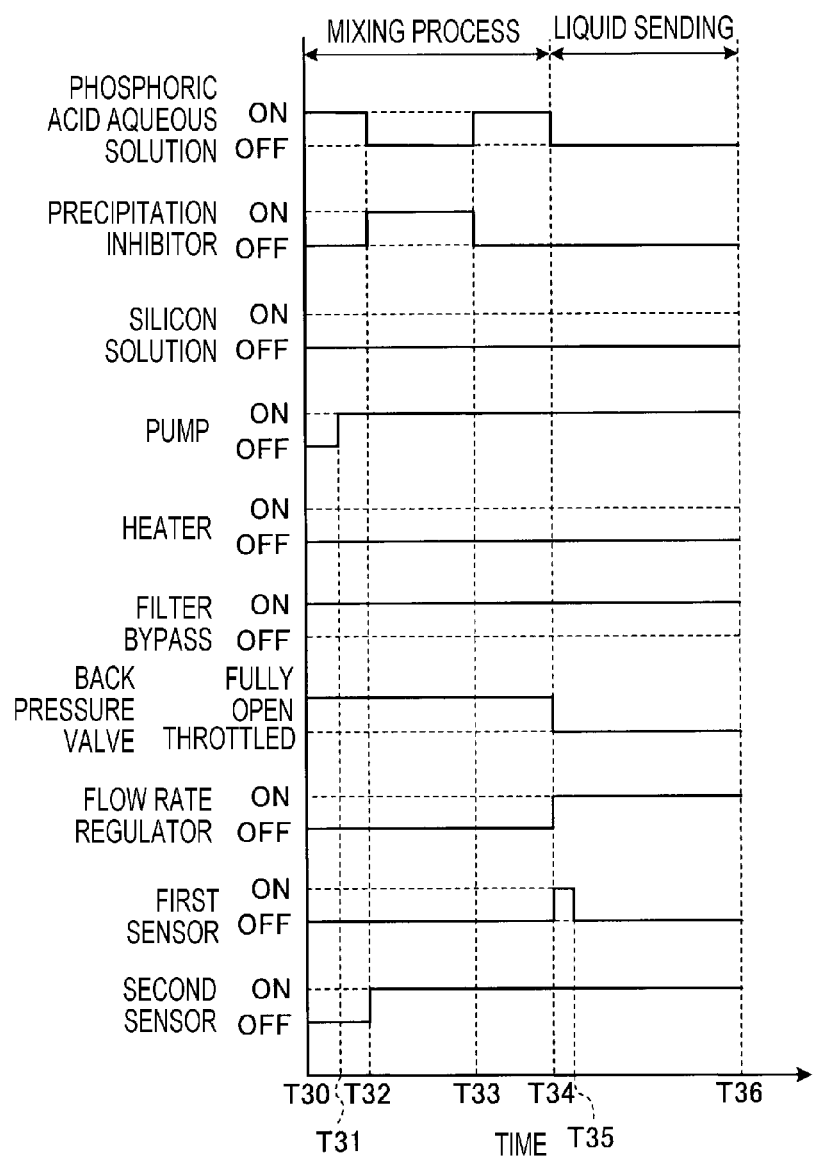
FIG. 8 is a timing chart illustrating a specific example of a behavior pattern of each unit in the substrate processing system, during various processes when the silicon concentration of the etching liquid is adjusted in the processing bath according to the third modification of the embodiment.

FIG. 8 is a timing chart illustrating a specific example of a behavior pattern of each unit in the substrate processing system 1, during various processes when the silicon concentration of the etching liquid E is adjusted in the processing bath 31 according to the third modification of the embodiment.

In FIG. 8, descriptions will be made on a mixing process to a liquid sending process of the mixture liquid M to be sent when silicon is eluted into the etching liquid E from the wafer W after the etching processing on the wafer W is started in the processing bath 31.

First, the controller starts the mixing process by operating (turning ON) the phosphoric acid aqueous solution supply 11 from time T30, and supplying the phosphoric acid aqueous solution to the tank 14.

At this point in time T30, the precipitation inhibitor supply 12, the silicon solution supply 25, the pump 16, and the heater 17 are not operating (OFF state). At the point in time T30, since the open/close valve 18 is in a close state and the open/close valve 21 is in an open state, in this state, the filter 19 is bypassed by the bypass flow path 20 (the filter bypass is in an ON state), and the back pressure valve 51 is in a fully open state.

At point in time T30, the flow rate regulator 23 is in a close state (OFF state), and OFF signals are output from the first liquid level sensor S1 and the second liquid level sensor S2 since nothing is stored in the tank 14.

Then, at time T31 when the phosphoric acid aqueous solution has been supplied in a predetermined amount to the tank 14, the controller forms a circulating flow in the circulation path 15 by operating (turning ON) the pump 16.

Next, the liquid level of the phosphoric acid aqueous solution stored in the tank 14 gradually rises. When the liquid level becomes equal to or higher than the predetermined second height at time T32, an ON signal is output from the second liquid level sensor S2. Then, the controller supplies the precipitation inhibitor to the tank 14 by operating (turning ON) the precipitation inhibitor supply 12 from time T32, and stops (turns OFF) the phosphoric acid aqueous solution supply 11.

Next, at time T33 when the precipitation inhibitor has been supplied in a predetermined amount to the tank 14, the controller stops (turns OFF) the precipitation inhibitor supply 12, and supplies the phosphoric acid aqueous solution to the tank 14 by operating (turning ON) the phosphoric acid aqueous solution supply 11.

Next, at time T34, when the liquid level of the mixture liquid M becomes equal to or higher than the predetermined first height, an ON signal is output from the first liquid level sensor S1. Then, the controller considers that the phosphoric acid aqueous solution has been supplied in a predetermined amount to the tank 14, and stops (turns OFF) the phosphoric acid aqueous solution supply 11 at time T34. Accordingly, the mixing process is completed.

Next, the controller starts the liquid sending process from time T34. Specifically, at time T34, the controller places (turns ON) the flow rate regulator 23 in an open state and places the back pressure valve 51 in a throttled state. Although not illustrated in FIG. 8, the controller changes the valve 53 to a close state, and changes the valve 54 to an open state.

Accordingly, the controller sends the mixture liquid M from the mixing device 10 to the outer tank 31b of the substrate processor 30 through the circulation path 15, the liquid sending path 22, and the liquid sending path 22d. Then, the mixture liquid M within the tank 14 is reduced, and the liquid level becomes lower than the predetermined first height at time T35. Accordingly, an OFF signal is output from the first liquid level sensor S1.

Here, in the third modification, the controller performs a control of always maintaining the silicon concentration within the processing bath 31 at a constant level or less, based on the silicon concentration of the etching liquid E within the processing bath 31, which is obtained from the silicon concentration sensor 42.

For example, when the silicon concentration of the etching liquid E within the processing bath 31 becomes higher than a given threshold, the controller discharges the etching liquid E having a high silicon concentration by placing the flow rate regulator 34b in an open state, and supplies the mixture liquid M in the same amount as the discharged etching liquid E.

Here, in third modification, since the mixing process of the mixture liquid M is completed by the mixing device 10, the mixture liquid M not containing the silicon solution may be supplied to the processing bath 31 when necessary.

Accordingly, the controller may keep the amount of the etching liquid E stored within the processing bath 31 constant and reduce the silicon concentration of the etching liquid E within the processing bath 31. Therefore, according to the third modification, it is possible to always maintain the silicon concentration within the processing bath 31 at a constant level or less.

In the third modification, when the supply of the mixture liquid M in the processing bath 31 is unnecessary, the controller may return the mixture liquid M flowing through the liquid sending path 22d from the return path 24 to the tank 14.

That is, when the supply of the mixture liquid M in the processing bath 31 is unnecessary, the controller may change the valve 58 to a close state and change the valve 59 to an open state, so that the mixture liquid M may be circulated by using the circulation path 15, the liquid sending path 22, the liquid sending path 22d, and the return path 24.

Accordingly, a state where the mixture liquid M is discharged from the liquid sending path 22d to the outer tank 31b (that is, a state where the supply of the mixture liquid M is necessary) may be aligned with a state where the mixture liquid M is not discharged from the liquid sending path 22d to the outer tank 31b (that is, a state where the supply of the mixture liquid M is unnecessary).

Accordingly, according to the third modification, since the mixture liquid M may be more accurately discharged, it is possible to more accurately perform a processing of always maintaining the silicon concentration within the processing bath 31 at a constant level or less.

In the third modification, during the liquid sending process of the mixture liquid M, the controller may place the back pressure valve 51 in a throttled state. Accordingly, the controller may increase the pressure of the diverging portion 15c in the circulation path 15, and thus, it is possible to secure the pressure required to return the mixture liquid M from the diverging portion 15c to the tank 14 through the liquid sending path 22, the liquid sending path 22d, and the return path 24.

In the third modification, when the flow rate of the mixture liquid M discharged from the liquid sending path 22d to the outer tank 31b is adjusted, the flow rate is roughly adjusted by using the throttle valve 57, and the flow rate is finely adjusted by using the flow meter 55 and the constant pressure valve 56.

Here, in the third modification, the pressure of the mixture liquid M within the flow meter 55 may be feedback-controlled by the constant pressure valve 56 so that the flow rate of the mixture liquid M within the flow meter 55 may be kept constant. Accordingly, since the mixture liquid M may be discharged in a more accurate amount, it is possible to more accurately perform a processing of always maintaining the silicon concentration within the processing bath 31 at a constant level or less.

In the third modification, when adjusting the silicon concentration of the etching liquid E, the controller may supply the mixture liquid M to the outer tank 31b instead of the inner tank 31a. Accordingly, as compared to that in the case where the mixture liquid M is directly supplied to the inner tank 31a where the wafer W is being processed, the silicon concentration of the etching liquid E in the inner tank 31a may be suppressed from being rapidly changed.

Therefore, according to the third modification, it is possible to stably perform the etching processing of the wafer W.

In the third modification, when the silicon concentration of the etching liquid E is adjusted, the mixture liquid M at room temperature may be supplied to the processing bath 31. Accordingly, since the heating process may be omitted, the time until the liquid sending process of the mixture liquid M may be shortened. Therefore, according to the third modification, it is possible to quickly perform the adjustment processing of the silicon concentration.

When the silicon concentration of the etching liquid E is adjusted, the mixture liquid M is supplied to the outer tank 31b and then is heated by the heater 40 until reaching the inner tank 31a. Thus, there is no particular problem even if the heating process is omitted during generation of the mixture liquid M.

In the third modification, when the silicon concentration of the etching liquid E is adjusted, the filtration process of the mixture liquid M may be omitted. Accordingly, since the time until the liquid sending process of the mixture liquid M may be shortened, it is possible to quickly perform the adjustment processing of the silicon concentration.

When the silicon concentration of the etching liquid E is adjusted, the mixture liquid M is supplied to the outer tank 31b, and then is filtered through the filter 41 until reaching the inner tank 31a. Thus, there is no particular problem even if the filtration process is omitted during generation of the mixture liquid M.

Figure 9:
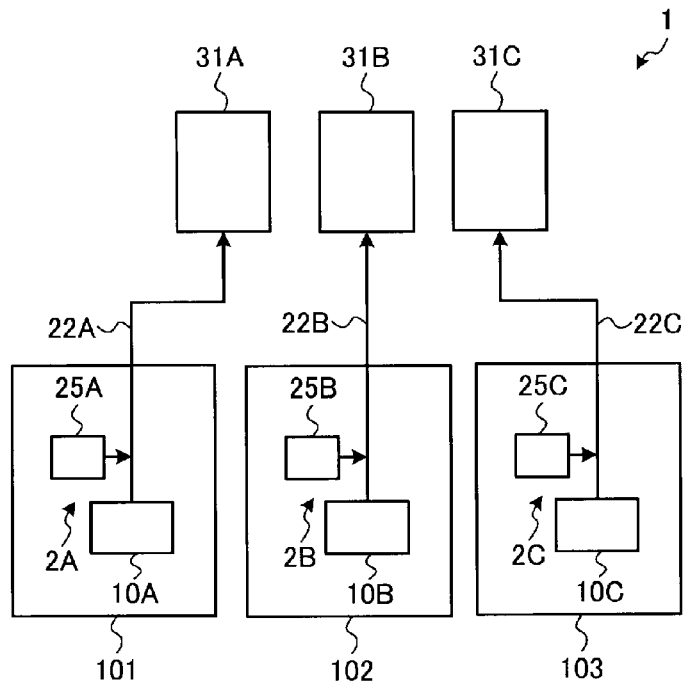
FIG. 9 is a schematic block diagram illustrating a configuration of the substrate processing system according to a fourth modification of the embodiment.

FIG. 9 is a schematic block diagram illustrating a configuration of the substrate processing system 1 according to a fourth modification of the embodiment. In the following modifications, descriptions will be made on a case where three processing baths 31A to 31C are provided in the substrate processing system 1.

In the substrate processing system 1 according to the fourth modification, three cabinets 101 to 103 are provided. The cabinet 101 accommodates an etching liquid supply 2A constituted by a mixing device 10A and a silicon solution supply 25A. Then, for example, the mixture liquid M (see FIG. 1) is supplied from such an etching liquid supply 2A to the processing bath 31A through a liquid sending path 22A.

The cabinet 102 accommodates an etching liquid supply 2B constituted by a mixing device 10B and a silicon solution supply 25B. Then, the mixture liquid M and the silicon solution are supplied from such an etching liquid supply 2B to the processing bath 31B through a liquid sending path 22B.

The cabinet 103 accommodates an etching liquid supply 2C constituted by a mixing device 10C and a silicon solution supply 25C. Then, the mixture liquid M and the silicon solution are supplied from such an etching liquid supply 2C to the processing bath 31C through a liquid sending path 22C.

In the following description, the etching liquid supplies 2A to 2C may also be collectively referred to as "the etching liquid supply 2," the mixing devices 10A to 10C may also be collectively referred to as "the mixing device 10," and the processing baths 31A to 31C may also be collectively referred to as "the processing bath 31."

Figure 10:
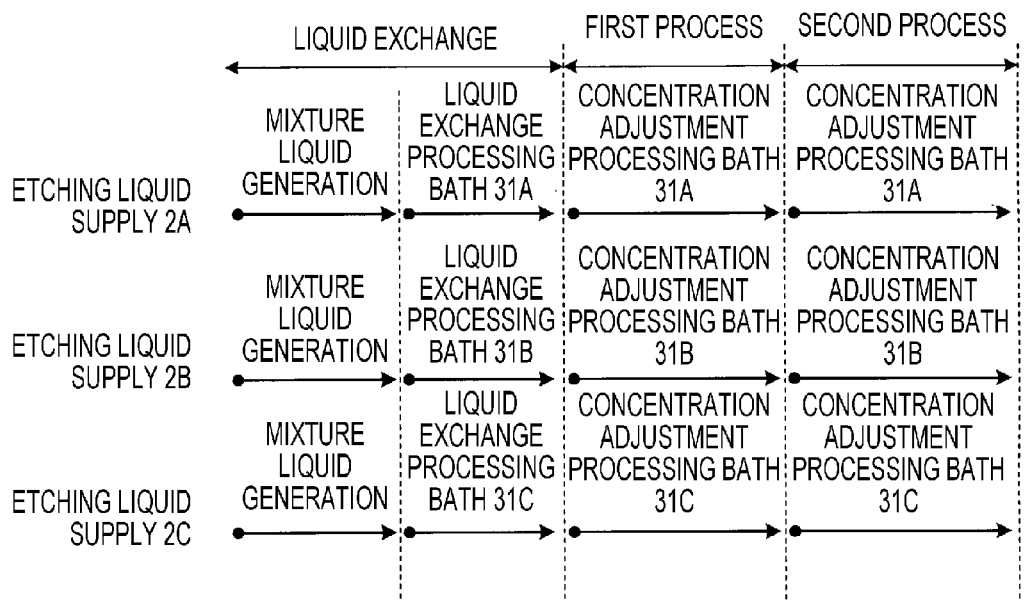
FIG. 10 is a view illustrating a specific example of the processing flow of a plurality of etching liquid supplies according to the fourth modification of the embodiment.

FIG. 10 is a view illustrating a specific example of the processing flow of the etching liquid supplies 2A to 2C according to the fourth modification of the embodiment. As illustrated in FIG. 10, when a liquid exchange process of the etching liquid E (hereinafter, also referred to as a "liquid exchange stage") is performed in each of the processing baths 31A to 31C, first, the etching liquid supply 2A generates the mixture liquid M by the mixing device 10A.

Next, the etching liquid supply 2A supplies the mixture liquid M from the mixing device 10A and the silicon solution from the silicon solution supply 25A to the processing bath 31A through the liquid sending path 22A, and performs the liquid exchange process in the processing bath 31A.

Likewise, in the liquid exchange stage, first, the etching liquid supply 2B generates the mixture liquid M by the mixing device 10B. Subsequently, the etching liquid supply 2B supplies the mixture liquid M from the mixing device 10B, and the silicon solution from the silicon solution supply 25B to the processing bath 31B through the liquid sending path 22B, and performs the liquid exchange process in the processing bath 31B.

Likewise, in the liquid exchange stage, first, the etching liquid supply 2C generates the mixture liquid M by the mixing device 10C. Subsequently, the etching liquid supply 2C supplies the mixture liquid M from the mixing device 10C, and the silicon solution from the silicon solution supply 25C to the processing bath 31C through the liquid sending path 22C, and performs the liquid exchange process in the processing bath 31C.

That is, in the liquid exchange stage where the wafer W is not immersed in the processing bath 31, the etching liquid supply 2 supplies the mixture liquid M and the silicon solution to the processing bath 31.

As illustrated in FIG. 10, subsequently to the liquid exchange stage, in each of the processing baths 31A to 31C, a first process (hereinafter, also referred to as a "first process step") of the wafer W is performed. In such a first process step, since the wafer W is immersed in the processing bath 31A, silicon is eluted from the wafer W.

Therefore, in order to adjust the silicon concentration of the processing bath 31A, the etching liquid supply 2A generates the mixture liquid M by the mixing device 10A while supplying the generated mixture liquid M to the processing bath 31A. The substrate processing system 1 performs a concentration adjustment processing of the processing bath 31A by discharging the mixture liquid M containing the silicon solution from the processing bath 31A through the etching liquid drainage section 34 (see FIG. 1).

That is, in the first process step where the wafer W is immersed in the processing bath 31, the mixture liquid M not containing the silicon solution is supplied to the processing bath 31, and the mixture liquid M containing the silicon solution (that is, the etching liquid E) is discharged from the processing bath 31.

Likewise, in the first process step, the etching liquid supply 2B generates the mixture liquid M by the mixing device 10B while supplying the generated mixture liquid M to the processing bath 31B. The substrate processing system 1 performs a concentration adjustment processing of the processing bath 31B by discharging the mixture liquid M containing the silicon solution from the processing bath 31B through the etching liquid drainage section 34.

Likewise, in the first process step, the etching liquid supply 2C generates the mixture liquid M by the mixing device 10C while supplying the generated mixture liquid M to the processing bath 31C. The substrate processing system 1 performs a concentration adjustment processing of the processing bath 31C by discharging the mixture liquid M containing the silicon solution from the processing bath 31C through the etching liquid drainage section 34.

Then, in a second process of the wafer W to be performed subsequently to the first process step (hereinafter, also referred to as a "second process step") as well, in the etching liquid supplies 2A to 2C, the same processing as that in the first process step is performed.

As described above, in the fourth modification, one etching liquid supply 2 is connected to one processing bath 31. Accordingly, there is no need to provide a plurality of etching liquid supplies 2 to each processing bath 31. Thus, the substrate processing system 1 may be configured at a low cost.

In the fourth modification, the mixture liquid M is generated by the mixing device 10 while the generated mixture liquid M is supplied to the processing bath 31. That is, when the discharge amount of the mixture liquid M discharged from the processing bath 31 for the purpose of the concentration adjustment is equal to the generation amount of the mixture liquid M that may be generated by the mixing device 10, the processing flow illustrated in FIG. 10 may be performed.

Figure 11:
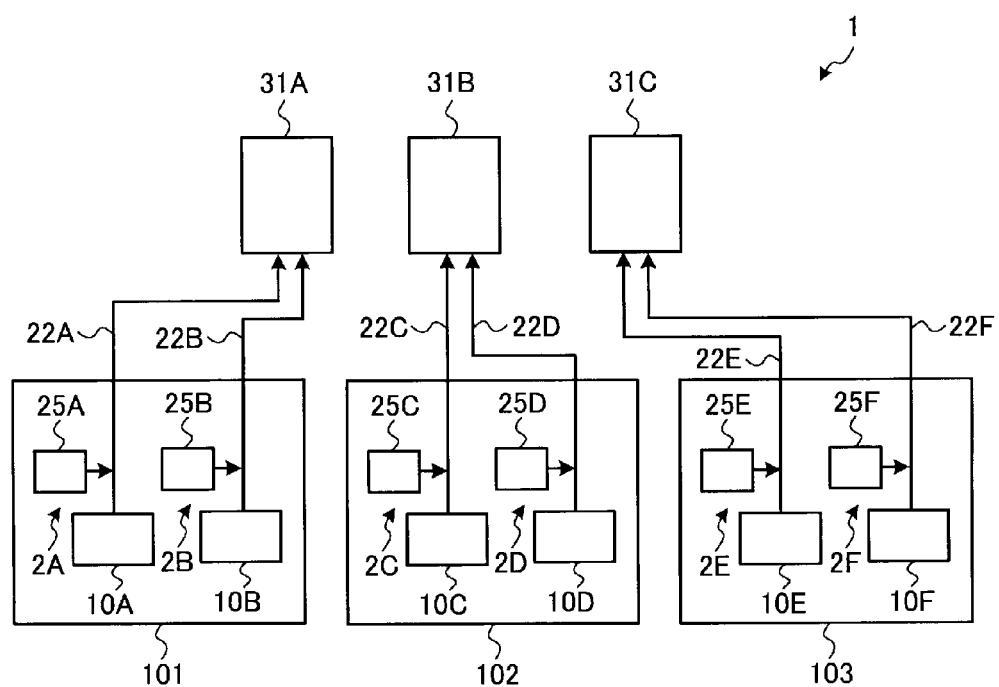
FIG. 11 is a schematic block diagram illustrating a configuration of the substrate processing system according to a fifth modification of the embodiment.

FIG. 11 is a schematic block diagram illustrating a configuration of the substrate processing system 1 according to a fifth modification of the embodiment. In the substrate processing system 1 according to the fifth modification, three cabinets 101 to 103 are provided.

The cabinet 101 accommodates an etching liquid supply 2A constituted by a mixing device 10A and a silicon solution supply 25A, and an etching liquid supply 2B constituted by a mixing device 10B and a silicon solution supply 25B.

Then, for example, the mixture liquid M (see FIG. 1) is supplied from the etching liquid supply 2A to a processing bath 31A through a liquid sending path 22A, and the mixture liquid M and the silicon solution are supplied from the etching liquid supply 2B to the processing bath 31A through a liquid sending path 22B.

The cabinet 102 accommodates an etching liquid supply 2C constituted by a mixing device 10C and a silicon solution supply 25C, and an etching liquid supply 2D constituted by a mixing device 10D and a silicon solution supply 25D.

Then, the mixture liquid M and the silicon solution are supplied from the etching liquid supply 2C to a processing bath 31B through a liquid sending path 22C, and the mixture liquid M and the silicon solution are supplied from the etching liquid supply 2D to the processing bath 31B through a liquid sending path 22D.

The cabinet 103 accommodates an etching liquid supply 2E constituted by a mixing device 10E and a silicon solution supply 25E, and an etching liquid supply 2F constituted by a mixing device 10F and a silicon solution supply 25F.

Then, the mixture liquid M and the silicon solution are supplied from the etching liquid supply 2E to a processing bath 31C through a liquid sending path 22E, and the mixture liquid M and the silicon solution are supplied from the etching liquid supply 2F to the processing bath 31C through a liquid sending path 22F.

Figure 12:
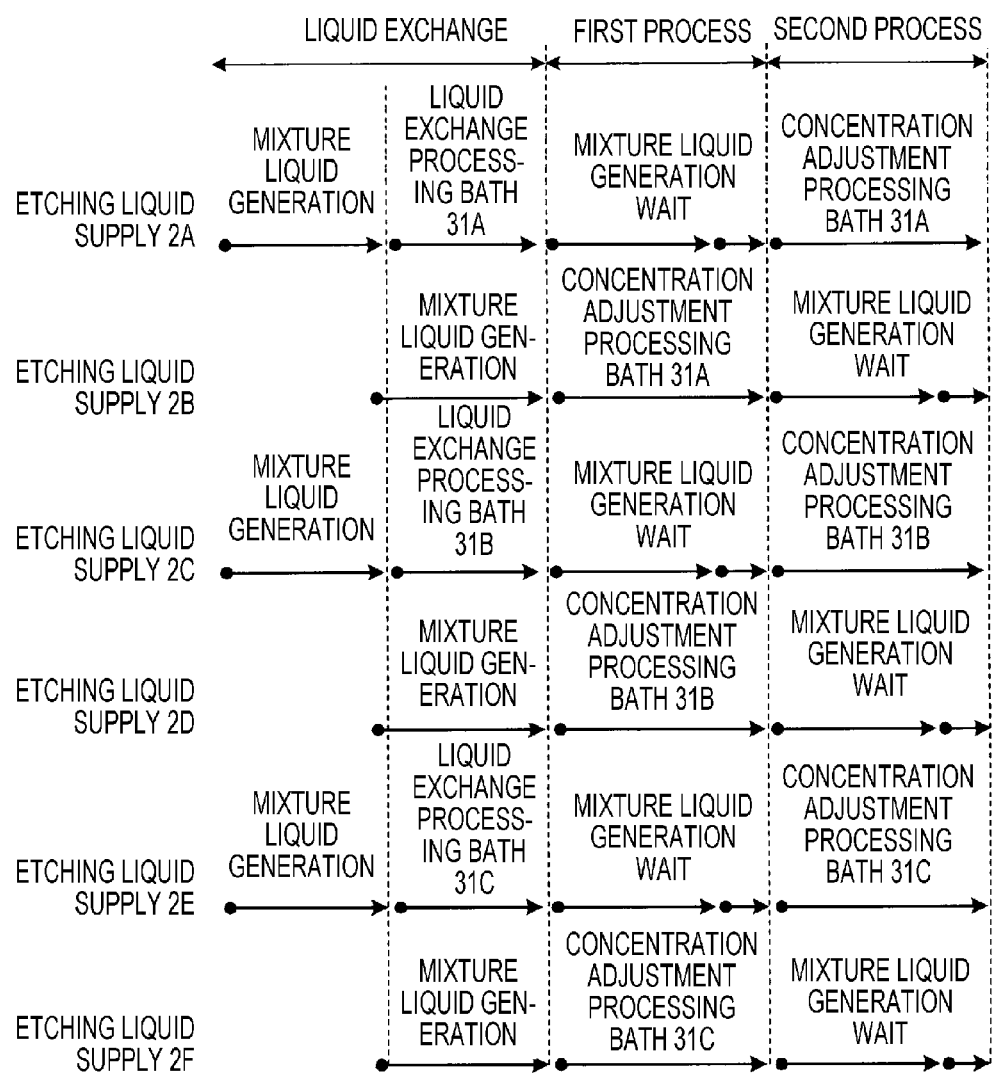
FIG. 12 is a view illustrating a specific example of the processing flow of a plurality of etching liquid supplies according to the fifth modification of the embodiment.

FIG. 12 is a view illustrating a specific example of the processing flow of the etching liquid supplies 2A to 2F according to the fifth modification of the embodiment. As illustrated in FIG. 12, in a liquid exchange stage, first, the etching liquid supply 2A generates the mixture liquid M by the mixing device 10A.

Next, the etching liquid supply 2A supplies the mixture liquid M from the mixing device 10A, and the silicon solution from the silicon solution supply 25A to the processing bath 31A through the liquid sending path 22A, and performs the liquid exchange process in the processing bath 31A.

In parallel with the liquid exchange process by the etching liquid supply 2A, the etching liquid supply 2B generates the mixture liquid M by the mixing device 10B.

Then, in a first process step to be performed subsequently to the liquid exchange stage, the etching liquid supply 2B supplies the mixture liquid M generated by the mixing device 10B to the processing bath 31A. The substrate processing system 1 performs a concentration adjustment processing of the processing bath 31A by discharging the mixture liquid M containing the silicon solution from the processing bath 31A through the etching liquid drainage section 34.

In parallel with the concentration adjustment processing by the etching liquid supply 2B, the etching liquid supply 2A generates the mixture liquid M by the mixing device 10A.

In the fifth modification, a mixture liquid generation time in the mixing device 10 is shorter than a processing time required for one etching processing. Therefore, in the fifth modification, after the mixture liquid M is generated in a predetermined amount, the etching liquid supply 2A waits until the following second process step.

Then, in a second process step to be performed subsequently to the first process step, the etching liquid supply 2A supplies the mixture liquid M generated by the mixing device 10A to the processing bath 31A. The substrate processing system 1 performs a concentration adjustment processing of the processing bath 31A by discharging the mixture liquid M containing the silicon solution from the processing bath 31A through the etching liquid drainage section 34.

In parallel with the concentration adjustment processing by the etching liquid supply 2A, the etching liquid supply 2B generates the mixture liquid M by the mixing device 10B. Then, after the mixture liquid M is generated in a predetermined amount, the etching liquid supply 2B waits until the following third process step.

As illustrated in FIG. 12, the same processes as the above described processes in the etching liquid supplies 2A and 2B are performed in the etching liquid supplies 2C and 2D, and the etching liquid supplies 2E and 2F.

As described above, in the fifth modification, two etching liquid supplies 2 are connected to one processing bath 31, and for each process, the mixture liquid M is exclusively supplied from the two etching liquid supplies 2.

Accordingly, the mixture liquid M that is accurately produced with a desired concentration or temperature may be supplied to the processing bath 31. Therefore, according to the fifth modification, it is possible to perform a highly accurate etching processing.

Figure 13:
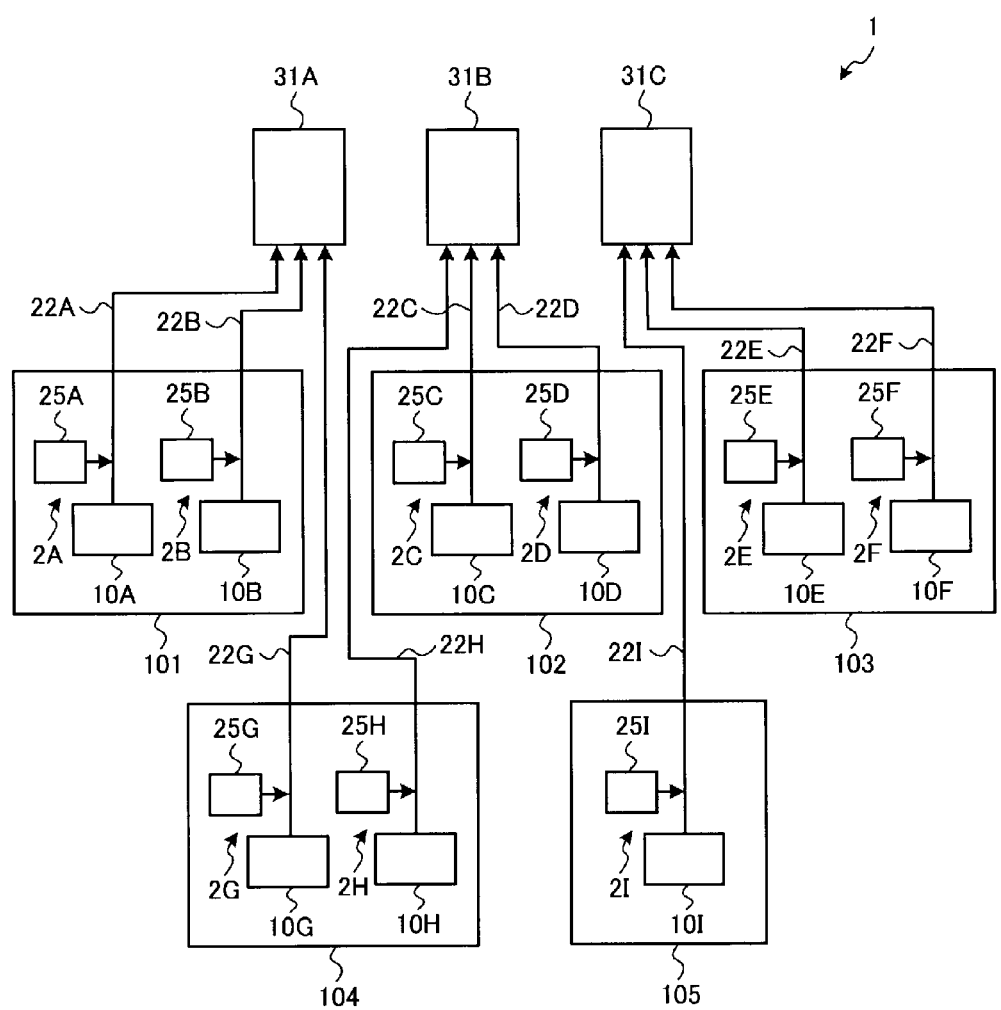
FIG. 13 is a schematic block diagram illustrating a configuration of the substrate processing system according to a sixth modification of the embodiment.

FIG. 13 is a schematic block diagram illustrating a configuration of the substrate processing system 1 according to a sixth modification of the embodiment. In the substrate processing system 1 according to the sixth modification, five cabinets 101 to 105 are provided.

In the substrate processing system 1 according to the sixth modification, the configuration of the cabinets 101 to 103 is the same as that in the above described fifth modification, and thus, detailed descriptions thereof will be omitted.

The cabinet 104 accommodates an etching liquid supply 2G constituted by a mixing device 10G and a silicon solution supply 25G, and an etching liquid supply 2H constituted by a mixing device 10H and a silicon solution supply 25H.

Then, the mixture liquid M and the silicon solution are supplied from the etching liquid supply 2G to the processing bath 31A through a liquid sending path 22G, and the mixture liquid M and the silicon solution are supplied from the etching liquid supply 2H to the processing bath 31B through a liquid sending path 22H.

The cabinet 105 accommodates an etching liquid supply 2I constituted by a mixing device 10I and a silicon solution supply 25I. Then, the mixture liquid M and the silicon solution are supplied from the etching liquid supply 2I to the processing bath 31C through a liquid sending path 22I.

Figure 14:
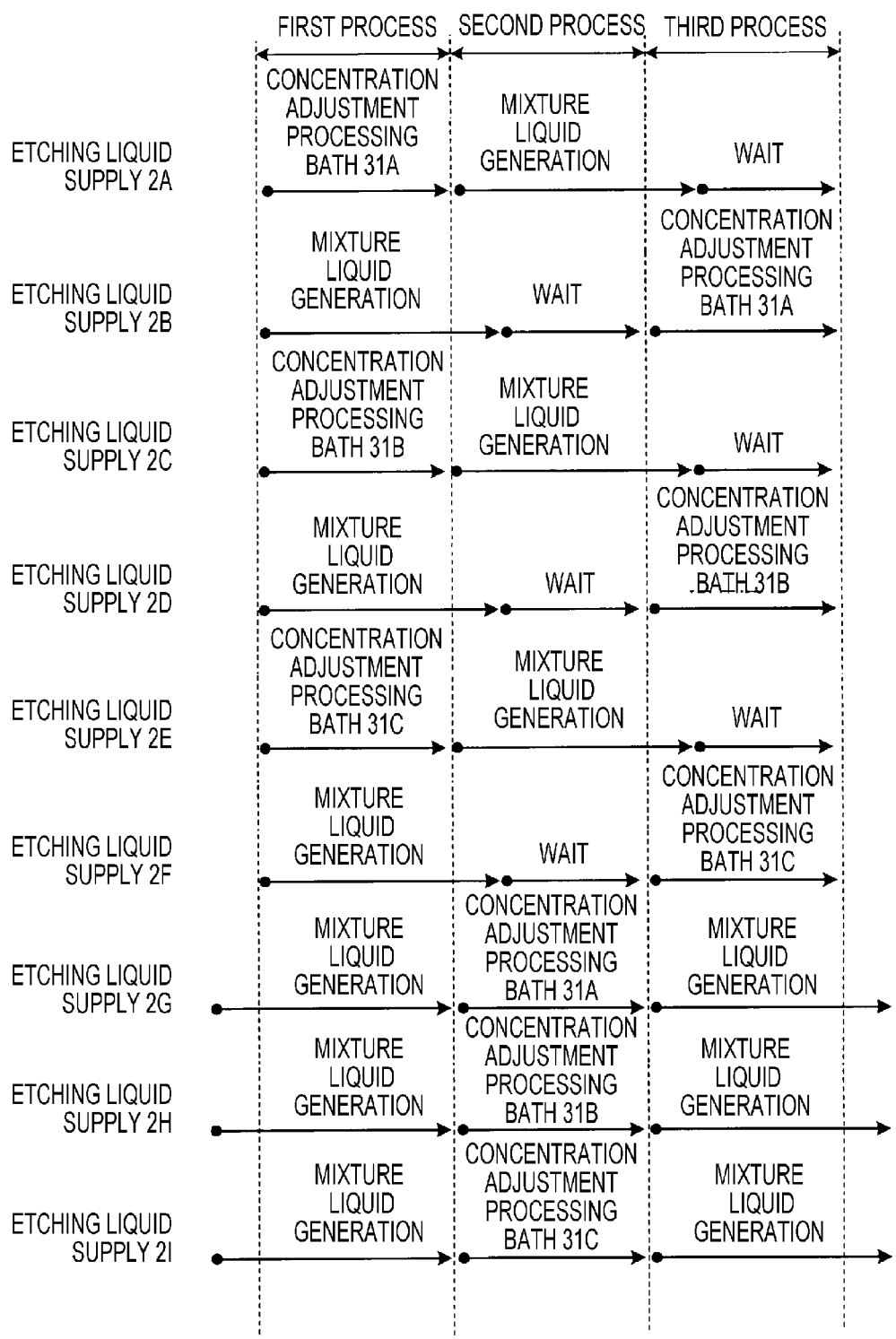
FIG. 14 is a view illustrating a specific example of the processing flow of a plurality of etching liquid supplies according to the sixth modification of the embodiment.

FIG. 14 is a view illustrating a specific example of the processing flow of the etching liquid supplies 2A to 2I according to the sixth modification of the embodiment. As illustrated in FIG. 14, in a first process step, the etching liquid supply 2A supplies the mixture liquid M generated by the mixing device 10A to the processing bath 31A.

The substrate processing system 1 performs a concentration adjustment processing of the processing bath 31A by discharging the mixture liquid M containing the silicon solution from the processing bath 31A through the etching liquid drainage section 34.

In parallel with the concentration adjustment processing by the etching liquid supply 2A, the etching liquid supply 2B generates the mixture liquid M by the mixing device 10B, and the etching liquid supply 2G generates the mixture liquid M by the mixing device 10G.

In the sixth modification, a mixture liquid generation time in the mixing device 10 is longer than a processing time required for one etching processing. Therefore, in a second process step to be performed subsequently to the first process step, a mixture liquid generation processing by the etching liquid supply 2B is not completed in time.

Therefore, in the sixth modification, the mixture liquid M is supplied to the processing bath 31A from the etching liquid supply 2G in which generation of the mixture liquid M is completed at a timing for the time for the second process step.

The substrate processing system 1 performs the concentration adjustment processing of the processing bath 31A by discharging the mixture liquid M containing the silicon solution from the processing bath 31A through the etching liquid drainage section 34.

In parallel with the concentration adjustment processing by the etching liquid supply 2G, the etching liquid supply 2B continues to generate the mixture liquid M by the mixing device 10B, and the etching liquid supply 2A generates the mixture liquid M by the mixing device 10A. After the mixture liquid M is generated in a predetermined amount, the etching liquid supply 2B waits until the following third process step.

Then, in the third process step to be performed subsequently to the second process step, the mixture liquid M is supplied to the processing bath 31A from the etching liquid supply 2B in which generation of the mixture liquid M is completed.

The substrate processing system 1 performs the concentration adjustment processing of the processing bath 31A by discharging the mixture liquid M containing the silicon solution from the processing bath 31A through the etching liquid drainage section 34.

In parallel with the concentration adjustment processing by the etching liquid supply 2B, the etching liquid supply 2A continues to generate the mixture liquid M by the mixing device 10A, and the etching liquid supply 2G generates the mixture liquid M by the mixing device 10G. After the mixture liquid M is generated in a predetermined amount, the etching liquid supply 2A waits until the following fourth process step.

As illustrated in FIG. 14, the same processes as the above described processes in the etching liquid supplies 2A, 2B, and 2G are performed in the etching liquid supplies 2C, 2D, and 2H, and the etching liquid supplies 2E, 2F, and 2I.

As described above, in the sixth modification, three etching liquid supplies 2 are connected to one processing bath 31, and the mixture liquid M is supplied from the three etching liquid supplies 2 in the order in which the mixture liquid M is generated.

Accordingly, even when a mixture liquid generation time in the mixing device 10 is longer than a processing time required for one etching processing, the mixture liquid M that is accurately produced with a desired concentration or temperature may be supplied to the processing bath 31.

Therefore, according to the sixth modification, even when a mixture liquid generation time in the mixing device 10 is longer than a processing time required for one etching processing, a highly accurate etching processing may be performed.

In the fifth modification and the sixth modification, descriptions have been made on an example in which the silicon solution supplies 25A to 25I are individually connected to the liquid sending paths 22A to 22I, respectively. Meanwhile, the present disclosure is not limited to a case where each silicon solution supply 25 is connected to each of the liquid sending paths 22A to 22I. Each silicon solution supply 25 may be provided for each of the processing baths 31A to 31C.

In the fifth modification and the sixth modification, descriptions have been made on an example in which three processing baths 31A to 31C are provided in the substrate processing system 1, but the number of the processing baths 31 provided in the substrate processing system 1 is not limited to three.

The substrate processing apparatus according to the embodiment (the substrate processing system 1) includes the processing bath 31, the mixing device 10, the liquid sending path 22, and the silicon solution supply 25. The processing bath 31 processes the substrate (the wafer W) through immersion. The mixing device 10 generates a mixture liquid M by mixing a phosphoric acid aqueous solution with an additive that suppresses precipitation of silicon oxide. The liquid sending path 22 sends the mixture liquid M from the mixing device 10 to the processing bath 31. The silicon solution supply 25 is connected to at least one of the liquid sending path 22 and the processing bath 31, and supplies a silicon-containing compound aqueous solution (a silicon solution) to the mixture liquid M supplied from the mixing device 10. Accordingly, it is possible to properly perform an etching processing by an etching liquid E containing a phosphoric acid aqueous solution and a silicon solution.

In the substrate processing apparatus according to the embodiment (the substrate processing system 1), the mixing device 10 includes the tank 14, and the circulation path 15 that exits from the tank 14 and returns to the tank 14, and the liquid sending path 22 is provided diverging from the circulation path 15. Accordingly, since there is no need to provide a separate pump in the liquid sending path 22 for the purpose of the liquid sending process of the mixture liquid M, it is possible to send the mixture liquid M at a low cost.

In the substrate processing apparatus according to the embodiment (the substrate processing system 1), the circulation path 15 includes the filter 19 that filters the mixture liquid M, and the bypass flow path 20 that bypasses the filter 19. Accordingly, since in the circulation path 15, a pressure loss occurring in the filter 19 may be reduced, it is possible to efficiently circulate the mixture liquid M stored in the tank 14.

The substrate processing apparatus according to the embodiment (the substrate processing system 1) further includes the back pressure valve 51 provided in the circulation path 15 on the downstream side of the diverging portion 15c from which the liquid sending path 22 diverges. Accordingly, it is possible to secure the pressure required to return the mixture liquid M from the diverging portion 15c to the tank 14 through the liquid sending path 22, the liquid sending path 22d, and the return path 24.

The substrate processing apparatus according to the embodiment (the substrate processing system 1) further includes the flow meter 55 and the thermometer 52 provided in the liquid sending path 22. The flow meter 55 corrects the flow rate of the mixture liquid M based on the temperature of the mixture liquid M measured by the thermometer 52. Accordingly, even when the temperature of the mixture liquid M is significantly changed in a range from a room temperature to a high temperature, it is possible to accurately evaluate the flow rate of the mixture liquid M flowing through the flow meter 55.

The substrate processing apparatus according to the embodiment (the substrate processing system 1) further includes the return path 24 that diverges from the downstream side of the flow meter 55 in the liquid sending path 22, and returns to the tank 14. Accordingly, it is possible to more accurately perform a processing of always maintaining the silicon concentration within the processing bath 31 at a constant level or less.

The substrate processing apparatus according to the embodiment (the substrate processing system 1) further includes the controller that controls the processing bath 31, the mixing device 10, the liquid sending path 22, and the silicon solution supply 25. The controller fully opens the back pressure valve 51 when the mixture liquid M is generated while circulating the mixture liquid M through the circulation path 15, and throttles the back pressure valve 51 when the mixture liquid M is sent to the liquid sending path 22. Accordingly, it is possible to secure the pressure required to return the mixture liquid M from the diverging portion 15c to the tank 14 through the liquid sending path 22, the liquid sending path 22d, and the return path 24.

The substrate processing apparatus according to the embodiment (the substrate processing system 1) further includes the controller that controls the processing bath 31, the mixing device 10, the liquid sending path 22, and the silicon solution supply 25. The mixing device 10 includes the heater 17 that heats the mixture liquid M, and the controller controls the heater 17 so as to set the temperature of the mixture liquid M based on whether to supply the silicon-containing compound aqueous solution (the silicon solution) to the mixture liquid M. Accordingly, when the silicon solution is supplied to the mixture liquid M, it is possible to suppress the silicon solution containing moisture from being exposed to a high temperature and being bumped. When the silicon solution is not supplied to the mixture liquid M, it is possible to suppress the temperature of the etching liquid E during the processing from being reduced due to the supply of the mixture liquid M.

In the substrate processing apparatus according to the embodiment (the substrate processing system 1), a plurality of mixing devices 10 is provided for one processing bath 31, and each of the mixing devices 10 exclusively supplies the mixture liquid M to one processing bath 31. Accordingly, the mixture liquid M that is accurately produced with a desired concentration or temperature may be supplied to the processing bath 31.

In the substrate processing apparatus according to the embodiment (the substrate processing system 1), a plurality of mixing devices 10 is provided for a plurality of processing baths 31, and the mixture liquid M is supplied to the processing bath 31 that requires the supply of the mixture liquid M from the mixing device 10 in which generation of the mixture liquid M is completed, in order. Accordingly, even when a mixture liquid generation time in the mixing device 10 is longer than a processing time required for one etching processing, the mixture liquid M that is accurately produced with a desired concentration or temperature may be supplied to the processing bath 31.

<Details of Mixing Process and Substrate Processing>

Figure 15:
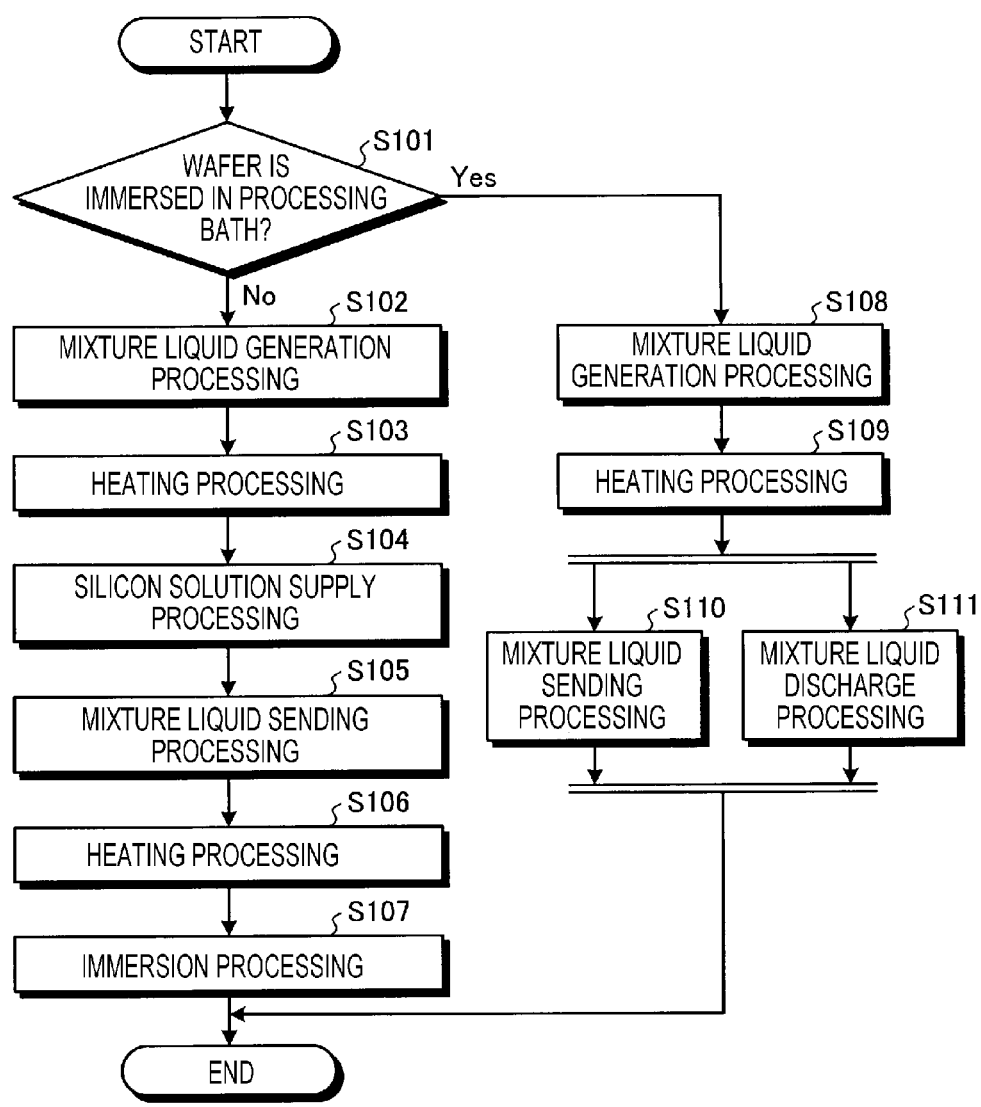
FIG. 15 is a flow chart illustrating a processing procedure of a mixing process and a substrate processing according to the embodiment.

Next, details of a mixing process and a substrate processing executed by the substrate processing system 1 according to the embodiment and the third modification will be described with reference to FIG. 15 and FIG. 16. FIG. 15 is a flow chart illustrating a processing procedure of a mixing process and a substrate processing according to the embodiment.

First, the controller determines whether a wafer W is immersed in the processing bath 31 (step S101). Then, when the wafer W is not immersed in the processing bath 31 (step S101, No), for example, when a liquid exchange process is performed in the processing bath 31, the controller performs a mixture liquid generation processing of generating a mixture liquid M by the mixing device 10 (step S102).

Next, the controller controls the heater 17 so as to perform a heating processing of heating the generated mixture liquid M (step S103). In this step S103, the controller heats the mixture liquid M to, for example, a predetermined temperature of less than 100° C.

Next, the controller controls the silicon solution supply 25 so as to perform a silicon solution supply processing of supplying a silicon solution to the processing bath 31 (step S104). Then, the controller controls the mixing device 10 and the liquid sending path 22 so as to perform a mixture liquid sending processing of sending the mixture liquid M to the processing bath 31 (step S105).

The order of the silicon solution supply processing in step S104 and the mixture liquid sending processing in step S105 may be reversed or the processings may be performed in parallel.

Next, the controller controls the substrate processor 30 so as to perform a heating processing of heating the mixture liquid M to which the silicon solution has been supplied (step S106). In this step S106, the controller heats the mixture liquid M to which the silicon solution has been supplied to, for example, a temperature of about 165° C.

Finally, the controller controls the substrate processor 30 so as to perform an immersion processing of immersing the wafer W in the mixture liquid M to which the silicon solution has been supplied (step S107), and completes the process.

Meanwhile, when the wafer W is immersed in the processing bath 31 (step S101, Yes), for example, when the wafer W is etched in the processing bath 31, the controller performs a mixture liquid generation processing of generating the mixture liquid M by the mixing device 10 (step S108).

Next, the controller controls the heater 17 so as to perform a heating processing of heating the generated mixture liquid M (step S109). In this step S109, the controller heats the mixture liquid M to, for example, a temperature of about 165° C.

Next, the controller controls the mixing device 10 and the liquid sending path 22 so as to perform a mixture liquid sending processing of sending the mixture liquid M to the processing bath 31 (step S110). In parallel with this mixture liquid sending processing, the controller performs a mixture liquid discharge processing of discharging the mixture liquid M containing the silicon solution from the processing bath 31 (step S111).

Accordingly, when silicon is eluted from a silicon nitride film within the wafer W and the silicon concentration of an etching liquid E becomes excessive, it is possible to quickly suppress the silicon concentration of the etching liquid E to a predetermined concentration. Then, when step S110 and step S111 are ended, the process is completed.

Figure 16:
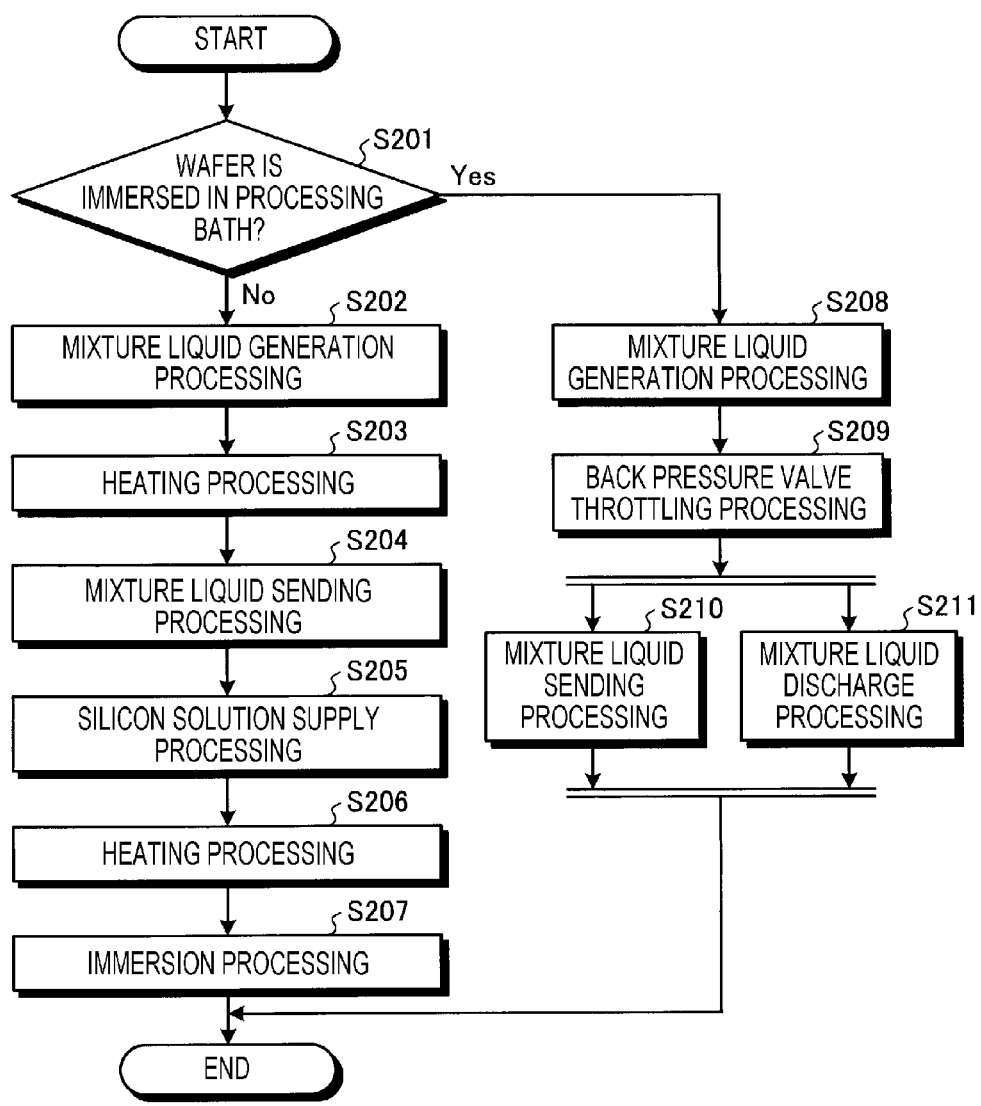
FIG. 16 is a flow chart illustrating a processing procedure of a mixing process and a substrate processing according to the third modification of the embodiment.

FIG. 16 is a flow chart illustrating a processing procedure of a mixing process and a substrate processing according to the third modification of the embodiment. First, the controller determines whether a wafer W is immersed in the processing bath 31 (step S201).

Then, when the wafer W is not immersed in the processing bath 31 (step S201, No), for example, when a liquid exchange process is performed in the processing bath 31, the controller performs a mixture liquid generation processing of generating a mixture liquid M by the mixing device 10 (step S202).

Next, the controller controls the heater 17 so as to perform a heating processing of heating the generated mixture liquid M (step S203). In this step S203, the controller heats the mixture liquid M to, for example, a predetermined temperature of less than 100° C.

Next, the controller controls the mixing device 10 and the liquid sending path 22 so as to perform a mixture liquid sending processing of sending the mixture liquid M to the processing bath 31 (step S204). Then, the controller controls the silicon solution supply 25 so as to perform a silicon solution supply processing of supplying a silicon solution to the processing bath 31 (step S205).

Next, the controller controls the substrate processor 30 so as to perform a heating processing of heating the mixture liquid M to which the silicon solution has been supplied (step S206). In this step S206, the controller heats the mixture liquid M to which the silicon solution has been supplied to, for example, a temperature of about 165° C.

Finally, the controller controls the substrate processor 30 so as to perform an immersion processing of immersing the wafer W in the mixture liquid M to which the silicon solution has been supplied (step S207), and completes the process.

Meanwhile, when the wafer W is immersed in the processing bath 31 (step S201, Yes), for example, when the wafer W is etched in the processing bath 31, the controller performs a mixture liquid generation processing of generating the mixture liquid M by the mixing device 10 (step S208).

Next, the controller controls the back pressure valve 51 so as to perform a back pressure valve throttling processing of changing the back pressure valve 51 from a fully open state to a throttled state (step S209).

Next, the controller controls the mixing device 10, the liquid sending path 22, and the return path 24 so as to perform a mixture liquid sending processing of sending the mixture liquid M to the processing bath 31 (step S210). In parallel with this mixture liquid sending processing, the controller performs a mixture liquid discharge processing of discharging the mixture liquid M containing the silicon solution from the processing bath 31 (step S211).

Accordingly, it is possible to always maintain the silicon concentration of the etching liquid E within the processing bath 31 at a constant level or less. Then, when step S210 and step S211 are ended, the process is completed.

The mixing method according to the embodiment includes a mixture liquid generation processing (step S102), and a silicon solution supply processing (step S104). In the mixture liquid generation processing (step S102), a mixture liquid M is generated by mixing a phosphoric acid aqueous solution with an additive (a precipitation inhibitor) that suppresses precipitation of silicon oxide. In the silicon solution supply processing (step S104), a silicon-containing compound aqueous solution (a silicon solution) is supplied to the generated mixture liquid M. Accordingly, it is possible to properly perform an etching processing by an etching liquid E containing a phosphoric acid aqueous solution and a silicon solution.

The substrate processing method according to the embodiment includes a mixture liquid generation processing (step S102), a silicon solution supply processing (step S104), and an immersion processing (step S107). In the mixture liquid generation processing (step S102), a mixture liquid M is generated by mixing a phosphoric acid aqueous solution with an additive (a precipitation inhibitor) that suppresses precipitation of silicon oxide. In the silicon solution supply processing (step S104), a silicon-containing compound aqueous solution (a silicon solution) is supplied to the generated mixture liquid M. In the immersion processing (step S107), a substrate (a wafer W) is immersed in the mixture liquid M to which the silicon solution has been supplied. Accordingly, it is possible to properly perform an etching processing by an etching liquid E containing a phosphoric acid aqueous solution and a silicon solution.

In the substrate processing method according to the embodiment, when the substrate is immersed in the processing bath 31, the mixture liquid M not containing the silicon-containing compound aqueous solution (the silicon solution) is supplied to the processing bath 31 (step S110). Along with this step S110, the mixture liquid M containing the silicon-containing compound aqueous solution (the silicon solution) is discharged from the processing bath 31 (step S111). Accordingly, when silicon is eluted from a silicon nitride film within the wafer W and the silicon concentration of the etching liquid E becomes excessive, it is possible to quickly suppress the silicon concentration of the etching liquid E to a predetermined concentration.

The substrate processing method according to the embodiment further includes a heating processing (step S106) of heating the mixture liquid M to which the silicon-containing compound aqueous solution (the silicon solution) has been supplied after the silicon solution supply processing (step S104). Accordingly, it is possible to perform an etching processing on the wafer W by the etching liquid E heated to a predetermined temperature.

In the substrate processing method according to the embodiment, in the mixture liquid generation processing (step S102), the mixture liquid M is circulated through the circulation path 15 by the mixing device 10 that includes the tank 14, and the circulation path 15 exiting from the tank 14 and returning to the tank 14. In the silicon solution supply processing (step S104), the mixture liquid M is sent to the processing bath 31 from the liquid sending path 22 that is provided diverging from the circulation path 15. In the mixture liquid generation processing (step S102), the back pressure valve 51 provided in the circulation path 15 on the downstream side of the diverging portion 15c from which the liquid sending path 22 diverges is fully open, and in the silicon solution supply processing (step S104), the back pressure valve 51 is throttled. Accordingly, it is possible to secure the pressure required to return the mixture liquid M from the diverging portion 15c to the tank 14 through the liquid sending path 22, the liquid sending path 22d, and the return path 24.

According to the present disclosure, it is possible to properly perform an etching processing by an etching liquid containing a phosphoric acid aqueous solution and a silicon solution.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a processing bath in which a substrate is immersed to be processed;
   a mixer including a tank and a circulation path that exits from the tank and returns to the tank, the mixer configured to generate a mixture liquid by mixing a phosphoric acid aqueous solution with an additive that suppresses precipitation of silicon oxide;
   a liquid sending path diverging from the circulation path at a diverging portion of the circulation path, the liquid sending path configured to send the mixture liquid from the mixer to the processing bath;
   a silicon solution supply connected to at least one of the liquid sending path and the processing bath, and configured to supply a silicon-containing compound aqueous solution to the mixture liquid supplied from the mixer; and
   a controller configured to control the processing bath, the mixer, the liquid path, and the silicon solution supply,
   wherein a back pressure valve is provided in the circulation path downstream from diverging portion,
   the liquid sending path includes a flow meter and a thermometer, the flow meter configured to correct a flow rate of the mixture liquid based on a temperature of the mixture liquid measured by the thermometer,
   the circulation path includes a return path that starts at the diverging portion where the liquid sending path including the flow meter diverges from the circulation path, and the return path continues downstream from the diverging portion to return to the tank, and
   the controller fully opens the back pressure valve when the mixture liquid is generated while circulating the mixture liquid through the circulation path, and throttles the back pressure valve when the mixture liquid is sent to the liquid sending path.

2. The substrate processing apparatus according to claim 1, wherein the circulation path includes a filter that filters the mixture liquid, and a bypass flow path that bypasses the filter.

3. The substrate processing apparatus according to claim 1,
   wherein the mixer includes a heater that heats the mixture liquid, and
   the controller controls the heater to set a temperature of the mixture liquid based on whether to supply the silicon-containing compound aqueous solution to the mixture liquid.

4. The substrate processing apparatus according to claim 1, wherein a plurality of mixers is provided for one processing bath, and
   each mixer of the plurality of mixers exclusively supplies the mixture liquid to the one processing bath.

5. The substrate processing apparatus according to claim 1, wherein a plurality of mixers is provided for a plurality of processing baths, and
   the mixture liquid is sequentially supplied to the plurality of processing baths that require supply of the mixture liquid starting from the mixer in which generation of the mixture liquid is completed.

6. A substrate processing apparatus comprising:
a processing bath in which a substrate is immersed to be processed;
a mixer configured to generate a mixture liquid by mixing a phosphoric acid aqueous solution with an additive that suppresses precipitation of silicon oxide, wherein the mixer includes a tank, and a circulation path that exits from the tank and returns to the tank;
a liquid sending path configured to send the mixture liquid from the mixer to the processing bath, wherein the liquid sending path is provided diverging from the circulation path;
a silicon solution supply connected to at least one of the liquid sending path and the processing bath, and configured to supply a silicon-containing compound aqueous solution to the mixture liquid supplied from the mixer;
a back pressure valve provided in the circulation path on a downstream side of a portion from which the liquid sending path diverges; and
a circuitry configured to control the back pressure valve to be fully open while circulating the mixture liquid through the circulation path so as to generate the mixture liquid, and to be throttled when the mixture liquid is sent to the liquid sending path.

7. The substrate processing apparatus according to claim 6, wherein the circulation path includes a filter that filters the mixture liquid, and a bypass flow path that bypasses the filter.

8. The substrate processing apparatus according to claim 6, further comprising:
a flow meter and a thermometer provided in the liquid sending path,
wherein the flow meter corrects a flow rate of the mixture liquid based on a temperature of the mixture liquid measured by the thermometer.

9. The substrate processing apparatus according to claim 8,
wherein the mixer includes a heater that heats the mixture liquid, and
the circuitry controls the heater to set a temperature of the mixture liquid based on whether to supply the silicon-containing compound aqueous solution to the mixture liquid.

10. The substrate processing apparatus according to claim 8, wherein a plurality of mixers is provided for one processing bath, and
each mixer of the plurality of mixers exclusively supplies the mixture liquid to the one processing bath.

11. The substrate processing apparatus according to claim 8, wherein a plurality of mixers is provided for a plurality of processing baths, and
the mixture liquid is sequentially supplied to the plurality of processing baths that require supply of the mixture liquid starting from the mixer in which generation of the mixture liquid is completed.

* * * * *